US010708031B1

(12) United States Patent
Muralidharan et al.

(10) Patent No.: US 10,708,031 B1
(45) Date of Patent: Jul. 7, 2020

(54) PBCH DECODING WITH PAYLOAD CHANGE DETECTION

(71) Applicant: QUALCOMM Incorporated, San Diego, CA (US)

(72) Inventors: Vijayvaradharaj Tirucherai Muralidharan, Bangalore (IN); Neha Gupta, Kanpur (IN); Gowrisankar Somichetty, Bangalore (IN); Shashidhar Vummintala, Bangalore (IN)

(73) Assignee: QUALCOMM Incorporated, San Diego, CA (US)

( * ) Notice: Subject to any disclaimer, the term of this patent is extended or adjusted under 35 U.S.C. 154(b) by 0 days.

(21) Appl. No.: 16/258,419

(22) Filed: Jan. 25, 2019

(51) Int. Cl.
*H04W 68/06* (2009.01)
*H04L 5/00* (2006.01)
(Continued)

(52) U.S. Cl.
CPC ....... *H04L 5/0096* (2013.01); *H03M 13/1125* (2013.01); *H04L 5/0053* (2013.01); *H04W 68/06* (2013.01); *H04W 72/005* (2013.01)

(58) Field of Classification Search
CPC .. H04W 72/005; H04W 68/06; H04L 5/0053; H04L 5/14; H04L 5/1469
See application file for complete search history.

(56) References Cited

U.S. PATENT DOCUMENTS 9,226,290 B2 * 12/2015 Gaal ................ H04W 72/0446
2012/0113866 A1 * 5/2012 Tenny .................. H04W 24/10
370/254

(Continued)

FOREIGN PATENT DOCUMENTS

WO WO-2011032107 A1 3/2011
WO WO-2016173922 A1 11/2016

OTHER PUBLICATIONS

Ericsson: "Reduced System Acquisition Time for MTC", 3GPP Draft, R1-1706881—Reduced System Acquisition Time for MTC, 3rd Generation Partnership Project (3GPP), Mobile Competence Centre, 650, Route Des Lucioles, F-06921 Sophia-Antipolis Cedex, France, vol. RAN WG1, No. Hangzhou, China, May 15, 2017-May 19, 2017, May 6, 2017 (May 6, 2017), XP051261540, 4 pages, Retrieved from the Internet: URL: http://www.3gpp.org/ftp/tsg_ran/WG1_RL1/TSGR1_89/Docs/. [retrieved on May 6, 2017] Section 2.
(Continued)

*Primary Examiner* — Wei Zhao
(74) *Attorney, Agent, or Firm* — Qualcomm IP Dept.; James Hunt Yancey, Jr.

(57) ABSTRACT

Methods, systems, and devices for wireless communications are described. The method includes monitoring a set of master information block broadcasts from a base station to obtain a first set of samples associated with a first prior target transmission time interval (TTI) and a second set of samples associated with a current TTI, identifying a payload change in the master information block broadcasts between the first set of one or more prior TTIs and the current TTI based on a comparison between the first set of samples and the second set of samples, modifying the first set of samples based on the identified payload change, and decoding a master information block based on a combination of the modified first set of samples and the second set of samples. Other aspects, embodiments, and features are also claimed and described.

30 Claims, 10 Drawing Sheets

(51) Int. Cl.
  *H04W 72/00*     (2009.01)
  *H03M 13/11*     (2006.01)

(56) References Cited

U.S. PATENT DOCUMENTS

| | | | |
|---|---|---|---|
| 2017/0194988 A1 | 7/2017 | Li | |
| 2018/0091285 A1* | 3/2018 | Hosseini | H04L 5/0083 |
| 2019/0281621 A1* | 9/2019 | Noh | H04W 72/1289 |

OTHER PUBLICATIONS

Ericsson: "Reduced System Acquisition Time for NB-IoT", 3GPP Draft; R1-1706894—Reduced System Acquisition Time for NB-IoT, 3rd Generation Partnership Project (3GPP), Mobile Competence Centre; 650, Route Des Lucioles; F-06921, Sophia-Antipolis Cedex; France, vol. RAN No. Hangzhou, China; May 15, 2017-May 19, 2017 May 6, 2017, XP051261553, Retrieved from the Internet: URL:http://www.3gpp.org/ftp/tsg_ran/WG1_RL1/TSGR1_89/Docs/ [retrieved on May 6, 2017], 6 pages.

International Search Report and Written Opinion—PCT/US2019/067400—ISA/EPO—dated Apr. 4, 2014.

\* cited by examiner

PBCH DECODING WITH PAYLOAD CHANGE DETECTION

TECHNICAL FIELD

The technology discussed below relates generally to wireless communications, and more specifically, to decoding data communicated between devices (e.g., a base station and a user equipment (UE)). Embodiments can enable and provide wireless communication decoding techniques for transmissions having payload changes (e.g., by detecting changes and combining message information from different transmission time intervals (TTIs)).

BACKGROUND

Wireless communications systems are widely deployed to provide various types of communication content such as voice, video, packet data, messaging, broadcast, and so on. These systems may be capable of supporting communication with multiple users by sharing the available system resources (e.g., time, frequency, and power). Examples of multiple-access systems include fourth generation (4G) systems such as Long Term Evolution (LTE) systems, LTE-Advanced (LTE-A) systems, or LTE-A Pro systems, and fifth generation (5G) systems which may be referred to as New Radio (NR) systems. These systems may employ technologies such as code division multiple access (CDMA), time division multiple access (TDMA), frequency division multiple access (FDMA), orthogonal frequency division multiple access (OFDMA), or discrete Fourier transform spread orthogonal frequency division multiplexing (DFT-S-OFDM).

A wireless multiple-access communications system may include a number of base stations and/or network access nodes. These devices can each simultaneously support communication for multiple communication devices (e.g., user equipment or UEs). In some cases, a base station may use a physical broadcast channel (PBCH) to periodically broadcast a master information block (MIB). In some examples, different redundancy versions of the same MIB may be broadcast multiple times within a target transmission time interval (TTI) period, but the payload of the MIB changes across TTI boundaries. UEs, such as enhanced machine type communication (eMTC) devices and narrow-band Internet of Things (NB-IOT) devices, can receive downlink transmissions at a relatively low signal-to-noise ratio (SNR). A lower SNR can reduce decoding efficiency and reliability, and as a result, such devices may benefit from improved MIB decoding techniques.

SUMMARY

Techniques discussed below relate to improved methods, systems, devices, and apparatuses that support physical broadcast channel (PBCH) decoding with payload change detection. Generally, the described techniques provide for a PBCH decoding scheme that includes detecting a change in PBCH payload and continuously combining samples (e.g., log-likelihood ratios, etc.) across target transmission time intervals (TTIs) to reduce associated decoding times. In some cases, the present techniques include monitoring master information block broadcasts from a base station to identify payload changes, modifying a first set of samples based on the identified payload change, and decoding a master information block based on a combination of the modified first set of samples and a second set of samples.

A method of wireless communication is described. The method may include monitoring a set of master information block broadcasts from a base station to obtain a first set of samples associated with a first prior target transmission time interval (TTI) and a second set of samples associated with a current TTI, identifying a payload change in the master information block broadcasts between the first TTI and the second TTI based on a comparison between the first set of samples and the second set of samples, modifying the first set of samples based on the identified payload change, and decoding a master information block based on a combination of the modified first set of samples and the second set of samples.

An apparatus for wireless communication is described. The apparatus may include a processor, memory in electronic communication with the processor, and instructions stored in the memory. The instructions may be executable by the processor to cause the apparatus to monitor a set of master information block broadcasts from a base station to obtain a first set of samples associated with a first prior target transmission time interval (TTI) and a second set of samples associated with a current TTI, identify a payload change in the master information block broadcasts between the first TTI and the second TTI based on a comparison between the first set of samples and the second set of samples, modify the first set of samples based on the identified payload change, and decode a master information block based on a combination of the modified first set of samples and the second set of samples.

Another apparatus for wireless communication is described. The apparatus may include means for monitoring a set of master information block broadcasts from a base station to obtain a first set of samples associated with a first prior target transmission time interval (TTI) and a second set of samples associated with a current TTI, identifying a payload change in the master information block broadcasts between the first TTI and the second TTI based on a comparison between the first set of samples and the second set of samples, modifying the first set of samples based on the identified payload change, and decoding a master information block based on a combination of the modified first set of samples and the second set of samples.

A non-transitory computer-readable medium storing code for wireless communication is described. The code may include instructions executable by a processor to monitor a set of master information block broadcasts from a base station to obtain a first set of samples associated with a first prior target transmission time interval (TTI) and a second set of samples associated with a current TTI, identify a payload change in the master information block broadcasts between the first TTI and the second TTI based on a comparison between the first set of samples and the second set of samples, modify the first set of samples based on the identified payload change, and decode a master information block based on a combination of the modified first set of samples and the second set of samples.

In some examples of the method, apparatuses, and non-transitory computer-readable medium described herein, modifying the first set of samples may include operations, features, means, or instructions for identifying coded bits corresponding to the identified payload change, and changing a sign of one or more samples in the first set of samples, the one or more samples corresponding to a system frame number.

Some examples of the method, apparatuses, and non-transitory computer-readable medium described herein may further include operations, features, means, or instructions for obtaining soft metrics for the first set of samples and the second set of samples by identifying a set of possible payload changes and determining a probability value for each possible payload change, and where identifying the payload change may be based on the soft metrics obtained for the first set of samples and the second set of samples.

Some examples of the method, apparatuses, and non-transitory computer-readable medium described herein may further include operations, features, means, or instructions for obtaining hard metrics for the first set of samples and the second set of samples by identifying a set of possible payload changes and selecting a most likely payload change from the set of possible payload changes, and where identifying the payload change may be based on the hard metrics obtained for the first set of samples and the second set of samples.

In some examples of the method, apparatuses, and non-transitory computer-readable medium described herein, identifying the payload change may include operations, features, means, or instructions for selecting the payload change from a fixed set of possible changes in a system frame number between the first TTI and the second TTI.

Some examples of the method, apparatuses, and non-transitory computer-readable medium described herein may further include operations, features, means, or instructions for identifying the payload change may be further based on a probability associated with the selected payload change.

In some examples of the method, apparatuses, and non-transitory computer-readable medium described herein, monitoring the set of master information block broadcasts may include operations, features, means, or instructions for obtaining a third set of samples associated with a second prior TTI.

Some examples of the method, apparatuses, and non-transitory computer-readable medium described herein may further include operations, features, means, or instructions for identifying a second payload change between the second prior TTI and the third prior TTI.

Some examples of the method, apparatuses, and non-transitory computer-readable medium described herein may further include operations, features, means, or instructions for modifying the third set of samples based on the identified second payload change.

Some examples of the method, apparatuses, and non-transitory computer-readable medium described herein may further include operations, features, means, or instructions for decoding the master information block may be based on a combination of the modified first set of samples, the modified third set of samples, and the second set of samples.

Some examples of the method, apparatuses, and non-transitory computer-readable medium described herein may further include operations, features, means, or instructions for aborting combining the first set of samples and the second set of samples based on a success of the decoding within a threshold amount of time.

In some examples of the method, apparatuses, and non-transitory computer-readable medium described herein, the samples include at least one of a sample from the base station unmodified by a user equipment, a sample from the base station modified by the user equipment, a log likelihood ratios, or any combination thereof.

DETAILED DESCRIPTION

Figure 1:
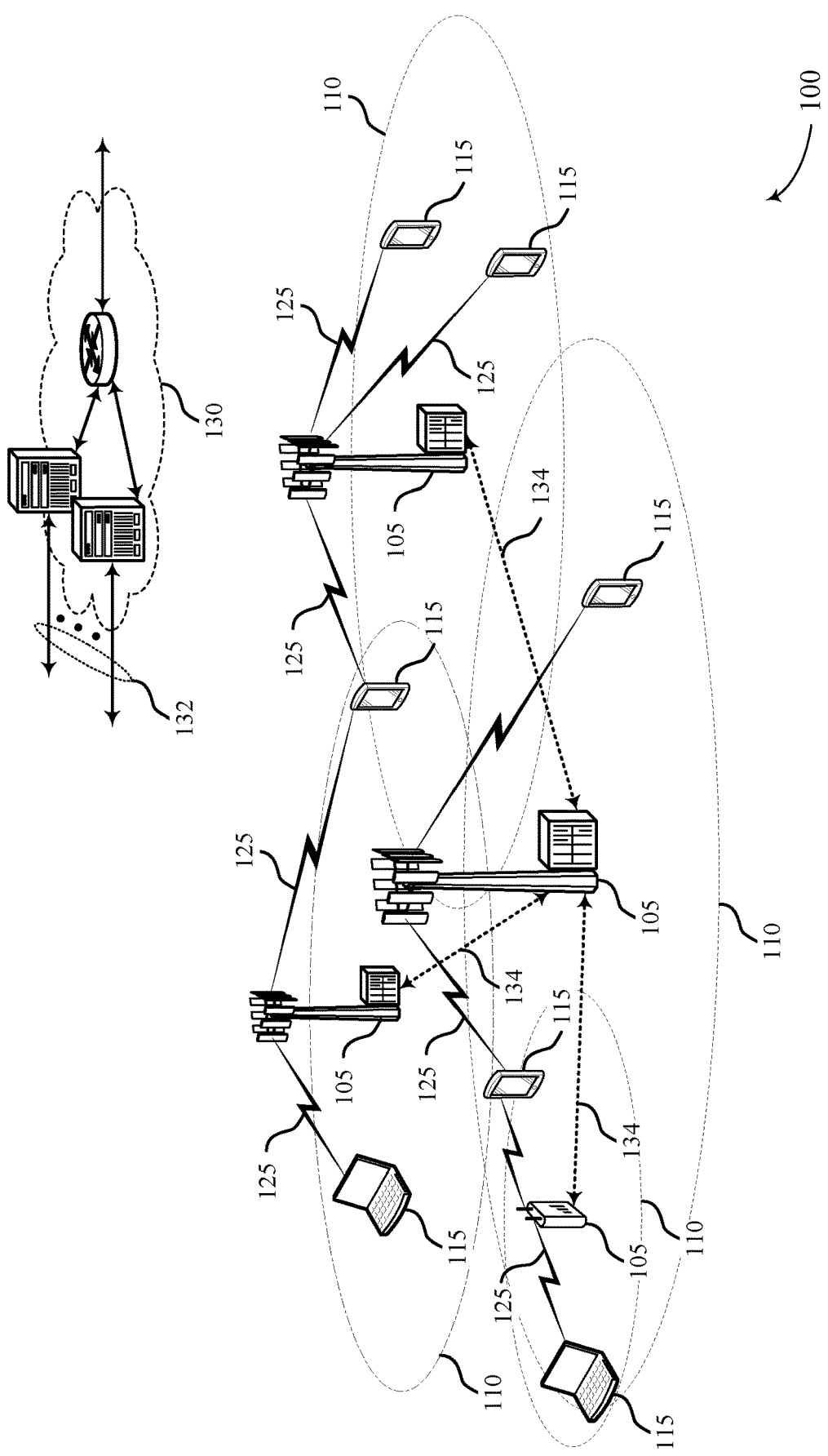
FIG. 1 illustrates an example of a system for wireless communications that supports PBCH decoding with payload change detection in accordance with aspects of the present disclosure.

The following relates generally to wireless communications, and more specifically to physical broadcast channel (PBCH) decoding with payload change detection in relation to information (e.g., control or data) communicated between a base station and a user equipment (UE).

In some cases, a base station may use a PBCH to periodically broadcast a master information block (MIB). The MIB may carry, for example, some combination of a system frame number (SFN), system bandwidth information, hybrid automatic repeat request (HARM) information, system information block, or other information. In some examples, different redundancy versions of the same MIB may be broadcast multiple times within a target transmission time (TTI) period. Across multiple TTIs, the SFN information carried in the MIB is expected to change, but the rest of the payload may be the same.

Some user equipment (UEs), such as enhanced machine type communication (eMTC) devices, narrow band Internet of Things (NB-IOT) devices, or other coverage-limited devices, may receive downlink transmissions at a relatively low signal-to-noise ratio (SNR). Such devices may be able to reduce the time it takes to decode a MIB from a base station by continuously combining samples from PBCH broadcasts across TTIs. Because the MIB payload changes across TTIs, straightforward combining of LLRs is not possible. Techniques described herein provide, for example, features enabling a UE to detect a change in MIB payload from log-likelihood ratios (LLRs) or other samples of a current TTI and one or more previous TTIs. And using this information (or knowledge), the UE can combine the samples across TTI boundaries to decode the MIB.

For example, the present techniques may include sampling a plurality of master information block broadcasts from a base station to obtain a first set of samples associated with a first prior target transmission time interval (TTI) and a second set of samples associated with a current TTI. In some examples, the present techniques may include identifying a payload change in the master information block broadcasts between the first set of one or more prior TTIs and the current TTI based at least in part on a comparison between the first set of samples and the second set of samples. In some cases, the present techniques may include modifying the first set of samples based at least in part on the identified payload change and decoding a master information block based at least in part on a combination of the modified first set of samples and the second set of samples.

Aspects of the disclosure are initially described in the context of a wireless communications system. Aspects of the disclosure may include performing one or more operations on data communicated between a base station and one or more UEs. In some cases, aspects of the disclosure may include performing one or more operations on data stored in buffers of the one or more UEs. Aspects of the disclosure are further illustrated by and described with reference to apparatus diagrams, system diagrams, and flowcharts that relate to PBCH decoding with payload change detection.

While aspects and embodiments are described in this application by illustration to some examples, those skilled in the art will understand that additional implementations and use cases may come about in many different arrangements and scenarios. Innovations described herein may be implemented across many differing platform types, devices, systems, shapes, sizes, packaging arrangements. For example, embodiments and/or uses may come about via integrated chip embodiments and other non-module-component based devices (e.g., end-user devices, vehicles, communication devices, computing devices, industrial equipment, retail/purchasing devices, medical devices, AI-enabled devices, etc.). While some examples may or may not be specifically directed to use cases or applications, a wide assortment of applicability of described innovations may occur. Implementations may range a spectrum from chip-level or modular components to non-modular, non-chip-level implementations and further to aggregate, distributed, or OEM devices or systems incorporating one or more aspects of the described innovations. In some practical settings, devices incorporating described aspects and features may also necessarily include additional components and features for implementation and practice of claimed and described embodiments. For example, transmission and reception of wireless signals necessarily includes a number of components for analog and digital purposes (e.g., hardware components including antenna, RF-chains, power amplifiers, modulators, buffer, processor(s), interleaver, adders/summers, etc.). It is intended that innovations described herein may be practiced in a wide variety of devices, chip-level components, systems, distributed arrangements, end-user devices, etc., of varying sizes, shapes, and constitution.

FIG. 1 illustrates an example of a wireless communications system 100 that supports PBCH decoding with payload change detection in accordance with aspects of the present disclosure. The wireless communications system 100 includes base stations 105, UEs 115, and a core network 130. In some examples, the wireless communications system 100 may be a Long Term Evolution (LTE) network, an LTE-Advanced (LTE-A) network, an LTE-A Pro network, a 5G network, or a New Radio (NR) network. In some cases, wireless communications system 100 may support enhanced broadband communications, ultra-reliable (e.g., mission critical) communications, low latency communications, or communications with low-cost and low-complexity devices.

Base stations 105 may wirelessly communicate with UEs 115 via one or more base station antennas. Base stations 105 described herein may include or may be referred to by those skilled in the art as a base transceiver station, a radio base station, an access point, a radio transceiver, a NodeB, an eNodeB (eNB), a next-generation NodeB or giga-NodeB (either of which may be referred to as a gNB), a Home NodeB, a Home eNodeB, or some other suitable terminology. Wireless communications system 100 may include base stations 105 of different types (e.g., macro or small cell base stations). The UEs 115 described herein may be able to communicate with various types of base stations 105 and network equipment including macro eNBs, small cell eNBs, gNBs, relay base stations, and the like.

Each base station 105 may be associated with a particular geographic coverage area 110 in which communications with various UEs 115 is supported. Each base station 105 may provide communication coverage for a respective geographic coverage area 110 via communication links 125, and communication links 125 between a base station 105 and a UE 115 may utilize one or more carriers. Communication links 125 shown in wireless communications system 100 may include uplink transmissions from a UE 115 to a base station 105, or downlink transmissions from a base station 105 to a UE 115. Downlink transmissions may also be called forward link transmissions while uplink transmissions may also be called reverse link transmissions.

The geographic coverage area 110 for a base station 105 may be divided into sectors making up a portion of the geographic coverage area 110, and each sector may be associated with a cell. For example, each base station 105 may provide communication coverage for a macro cell, a small cell, a hot spot, or other types of cells, or various combinations thereof. In some examples, a base station 105 may be movable and therefore provide communication coverage for a moving geographic coverage area 110. In some examples, different geographic coverage areas 110 associated with different technologies may overlap, and overlapping geographic coverage areas 110 associated with different technologies may be supported by the same base station 105 or by different base stations 105. The wireless communications system 100 may include, for example, a heterogeneous LTE/LTE-A/LTE-A Pro or NR network in which different types of base stations 105 provide coverage for various geographic coverage areas 110.

The term "cell" refers to a logical communication entity used for communication with a base station 105 (e.g., over a carrier), and may be associated with an identifier for distinguishing neighboring cells (e.g., a physical cell identifier (PCID), a virtual cell identifier (VCID)) operating via the same or a different carrier. In some examples, a carrier may support multiple cells, and different cells may be configured according to different protocol types (e.g., machine-type communication (MTC), narrowband Internet-of-Things (NB-IoT), enhanced mobile broadband (eMBB), or others) that may provide access for different types of devices. In some cases, the term "cell" may refer to a portion of a geographic coverage area 110 (e.g., a sector) over which the logical entity operates.

UEs 115 may be dispersed throughout the wireless communications system 100, and each UE 115 may be stationary or mobile. A UE 115 may also be referred to as a mobile device, a wireless device, a remote device, a handheld device, or a subscriber device, or some other suitable terminology, where the "device" may also be referred to as a unit, a station, a terminal, or a client. A UE 115 may also be a personal electronic device such as a cellular phone, a personal digital assistant (PDA), a tablet computer, a laptop computer, or a personal computer. UEs may also include or be integrated with industrial equipment, monitoring equipment, vehicular or automobile components, wearables, medical equipment, manufacturing equipment, robotic equipment, and many various types of devices capable of automated operations. In still yet other examples, a UE 115 may also refer to a wireless local loop (WLL) station, an Internet of Things (IoT) device, an Internet of Everything (IoE) device, or an MTC device, or the like, which may be implemented in various articles such as appliances, vehicles, meters, or the like.

Some UEs 115, such as MTC or IoT devices, may be low cost or low complexity devices, and may provide for automated communication between machines (e.g., via Machine-to-Machine (M2M) communication). M2M communication or MTC may refer to data communication technologies that allow devices to communicate with one another or a base station 105 without human intervention. In some examples, M2M communication or MTC may include communications from devices that integrate sensors or meters to measure or capture information and relay that information to a central server or application program that can make use of the information or present the information to humans interacting with the program or application. Some UEs 115 may be designed to collect information or enable automated behavior of machines. Examples of applications for MTC devices include smart metering, inventory monitoring, water level monitoring, equipment monitoring, healthcare monitoring, wildlife monitoring, weather and geological event monitoring, fleet management and tracking, remote security sensing, physical access control, and transaction-based business charging.

Some UEs 115 may be configured to employ operating modes that reduce power consumption, such as half-duplex communications (e.g., a mode that supports one-way communication via transmission or reception, but not transmission and reception simultaneously). In some examples half-duplex communications may be performed at a reduced peak rate. Other power conservation techniques for UEs 115 include entering a power saving "deep sleep" mode when not engaging in active communications, or operating over a limited bandwidth (e.g., according to narrowband communications). In some cases, UEs 115 may be designed to support critical functions (e.g., mission critical functions), and a wireless communications system 100 may be configured to provide ultra-reliable communications for these functions.

In some cases, a UE 115 may also be able to communicate directly with other UEs 115 (e.g., using a peer-to-peer (P2P) or device-to-device (D2D) protocol). One or more of a group of UEs 115 utilizing D2D communications may be within the geographic coverage area 110 of a base station 105. Other UEs 115 in such a group may be outside the geographic coverage area 110 of a base station 105, or be otherwise unable to receive transmissions from a base station 105. In some cases, groups of UEs 115 communicating via D2D communications may utilize a one-to-many (1:M) system in which each UE 115 transmits to every other UE 115 in the group. In some cases, a base station 105 facilitates the scheduling of resources for D2D communications. In other cases, D2D communications are carried out between UEs 115 without the involvement of a base station 105.

Base stations 105 may communicate with the core network 130 and with one another. For example, base stations 105 may interface with the core network 130 through backhaul links 132 (e.g., via an S1, N2, N3, or other interface). Base stations 105 may communicate with one another over backhaul links 134 (e.g., via an X2, Xn, or other interface) either directly (e.g., directly between base stations 105) or indirectly (e.g., via core network 130).

The core network 130 may provide user authentication, access authorization, tracking, Internet Protocol (IP) connectivity, and other access, routing, or mobility functions. The core network 130 may be an evolved packet core (EPC), which may include at least one mobility management entity (MME), at least one serving gateway (S-GW), and at least one Packet Data Network (PDN) gateway (P-GW). The MME may manage non-access stratum (e.g., control plane) functions such as mobility, authentication, and bearer management for UEs 115 served by base stations 105 associated with the EPC. User IP packets may be transferred through the S-GW, which itself may be connected to the P-GW. The P-GW may provide IP address allocation as well as other functions. The P-GW may be connected to the network operators IP services. The operators IP services may include access to the Internet, Intranet(s), an IP Multimedia Subsystem (IMS), or a Packet-Switched (PS) Streaming Service.

At least some of the network devices, such as a base station 105, may include subcomponents such as an access network entity, which may be an example of an access node controller (ANC). Each access network entity may communicate with UEs 115 through a number of other access network transmission entities, which may be referred to as a radio head, a smart radio head, or a transmission/reception point (TRP). In some configurations, various functions of each access network entity or base station 105 may be distributed across various network devices (e.g., radio heads and access network controllers) or consolidated into a single network device (e.g., a base station 105).

Wireless communications system 100 may operate using one or more frequency bands, typically in the range of 300 megahertz (MHz) to 300 gigahertz (GHz). Generally, the region from 300 MHz to 3 GHz is known as the ultra-high frequency (UHF) region or decimeter band, since the wavelengths range from approximately one decimeter to one meter in length. UHF waves may be blocked or redirected by buildings and environmental features. However, the waves may penetrate structures sufficiently for a macro cell to provide service to UEs 115 located indoors. Transmission of UHF waves may be associated with smaller antennas and shorter range (e.g., less than 100 km) compared to transmission using the smaller frequencies and longer waves of the high frequency (HF) or very high frequency (VHF) portion of the spectrum below 300 MHz.

Wireless communications system 100 may also operate in a super high frequency (SHF) region using frequency bands from 3 GHz to 30 GHz, also known as the centimeter band. The SHF region includes bands such as the 5 GHz industrial, scientific, and medical (ISM) bands, which may be used opportunistically by devices that may be capable of tolerating interference from other users.

Wireless communications system 100 may also operate in an extremely high frequency (EHF) region of the spectrum (e.g., from 30 GHz to 300 GHz), also known as the millimeter band. In some examples, wireless communications system 100 may support millimeter wave (mmW) communications between UEs 115 and base stations 105, and EHF antennas of the respective devices may be even smaller and more closely spaced than UHF antennas. In some cases, this may facilitate use of antenna arrays within a UE 115. However, the propagation of EHF transmissions may be subject to even greater atmospheric attenuation and shorter range than SHF or UHF transmissions. Techniques disclosed herein may be employed across transmissions that use one or more different frequency regions, and designated use of bands across these frequency regions may differ by country or regulating body.

In some cases, wireless communications system 100 may utilize both licensed and unlicensed radio frequency spectrum bands. For example, wireless communications system 100 may employ License Assisted Access (LAA), LTE-Unlicensed (LTE-U) radio access technology, or NR technology in an unlicensed band such as the 5 GHz ISM band. When operating in unlicensed radio frequency spectrum bands, wireless devices such as base stations 105 and UEs 115 may employ listen-before-talk (LBT) procedures to ensure a frequency channel is clear before transmitting data. In some cases, operations in unlicensed bands may be based on a carrier aggregation configuration in conjunction with component carriers operating in a licensed band (e.g., LAA). Operations in unlicensed spectrum may include downlink transmissions, uplink transmissions, peer-to-peer transmissions, or a combination of these. Duplexing in unlicensed spectrum may be based on frequency division duplexing (FDD), time division duplexing (TDD), or a combination of both.

In some examples, base station 105 or UE 115 may be equipped with multiple antennas, which may be used to employ techniques such as transmit diversity, receive diversity, multiple-input multiple-output (MIMO) communications, or beamforming. For example, wireless communications system 100 may use a transmission scheme between a transmitting device (e.g., a base station 105) and a receiving device (e.g., a UE 115), where the transmitting device is equipped with multiple antennas and the receiving device is equipped with one or more antennas. MIMO communications may employ multipath signal propagation to increase the spectral efficiency by transmitting or receiving multiple signals via different spatial layers, which may be referred to as spatial multiplexing. The multiple signals may, for example, be transmitted by the transmitting device via different antennas or different combinations of antennas. Likewise, the multiple signals may be received by the receiving device via different antennas or different combinations of antennas. Each of the multiple signals may be referred to as a separate spatial stream, and may carry bits associated with the same data stream (e.g., the same codeword) or different data streams. Different spatial layers may be associated with different antenna ports used for channel measurement and reporting. MIMO techniques include single-user MIMO (SU-MIMO) where multiple spatial layers are transmitted to the same receiving device, and multiple-user MIMO (MU-MIMO) where multiple spatial layers are transmitted to multiple devices.

Beamforming, which may also be referred to as spatial filtering, directional transmission, or directional reception, is a signal processing technique that may be used at a transmitting device or a receiving device (e.g., a base station 105 or a UE 115) to shape or steer an antenna beam (e.g., a transmit beam or receive beam) along a spatial path between the transmitting device and the receiving device. Beamforming may be achieved by combining the signals communicated via antenna elements of an antenna array such that signals propagating at particular orientations with respect to an antenna array experience constructive interference while others experience destructive interference. The adjustment of signals communicated via the antenna elements may include a transmitting device or a receiving device applying certain amplitude and phase offsets to signals carried via each of the antenna elements associated with the device. The adjustments associated with each of the antenna elements may be defined by a beamforming weight set associated with a particular orientation (e.g., with respect to the antenna array of the transmitting device or receiving device, or with respect to some other orientation).

In one example, a base station 105 may use multiple antennas or antenna arrays to conduct beamforming operations for directional communications with a UE 115. For instance, some signals (e.g. synchronization signals, reference signals, beam selection signals, or other control signals) may be transmitted by a base station 105 multiple times in different directions, which may include a signal being transmitted according to different beamforming weight sets associated with different directions of transmission. Transmissions in different beam directions may be used to identify (e.g., by the base station 105 or a receiving device, such as a UE 115) a beam direction for subsequent transmission and/or reception by the base station 105.

Some signals, such as data signals associated with a particular receiving device, may be transmitted by a base station 105 in a single beam direction (e.g., a direction associated with the receiving device, such as a UE 115). In some examples, the beam direction associated with transmissions along a single beam direction may be determined based at least in in part on a signal that was transmitted in different beam directions. For example, a UE 115 may receive one or more of the signals transmitted by the base station 105 in different directions, and the UE 115 may report to the base station 105 an indication of the signal it received with a highest signal quality, or an otherwise acceptable signal quality. Although these techniques are described with reference to signals transmitted in one or more directions by a base station 105, a UE 115 may employ similar techniques for transmitting signals multiple times in different directions (e.g., for identifying a beam direction for subsequent transmission or reception by the UE 115), or transmitting a signal in a single direction (e.g., for transmitting data to a receiving device).

A receiving device (e.g., a UE 115, which may be an example of a mmW receiving device) may try multiple receive beams when receiving various signals from the base station 105, such as synchronization signals, reference signals, beam selection signals, or other control signals. For example, a receiving device may try multiple receive directions by receiving via different antenna subarrays, by processing received signals according to different antenna subarrays, by receiving according to different receive beamforming weight sets applied to signals received at a plurality of antenna elements of an antenna array, or by processing received signals according to different receive beamforming weight sets applied to signals received at a plurality of antenna elements of an antenna array, any of which may be referred to as "listening" according to different receive beams or receive directions. In some examples a receiving device may use a single receive beam to receive along a single beam direction (e.g., when receiving a data signal). The single receive beam may be aligned in a beam direction determined based at least in part on listening according to different receive beam directions (e.g., a beam direction determined to have a highest signal strength, highest signal-to-noise ratio, or otherwise acceptable signal quality based at least in part on listening according to multiple beam directions).

In some cases, the antennas of a base station 105 or UE 115 may be located within one or more antenna arrays, which may support MIMO operations, or transmit or receive beamforming. For example, one or more base station antennas or antenna arrays may be co-located at an antenna assembly, such as an antenna tower. In some cases, antennas or antenna arrays associated with a base station 105 may be located in diverse geographic locations. A base station 105 may have an antenna array with a number of rows and columns of antenna ports that the base station 105 may use to support beamforming of communications with a UE 115. Likewise, a UE 115 may have one or more antenna arrays that may support various MIMO or beamforming operations.

In some cases, wireless communications system 100 may be a packet-based network that operate according to a layered protocol stack. In the user plane, communications at the bearer or Packet Data Convergence Protocol (PDCP) layer may be IP-based. A Radio Link Control (RLC) layer may perform packet segmentation and reassembly to communicate over logical channels. A Medium Access Control (MAC) layer may perform priority handling and multiplexing of logical channels into transport channels. The MAC layer may also use hybrid automatic repeat request (HARQ) to provide retransmission at the MAC layer to improve link efficiency. In the control plane, the Radio Resource Control (RRC) protocol layer may provide establishment, configuration, and maintenance of an RRC connection between a UE 115 and a base station 105 or core network 130 supporting radio bearers for user plane data. At the Physical layer, transport channels may be mapped to physical channels.

In some cases, UEs 115 and base stations 105 may support retransmissions of data to increase the likelihood that data is received successfully. HARQ feedback is one technique of increasing the likelihood that data is received correctly over a communication link 125. HARQ may include a combination of error detection (e.g., using a cyclic redundancy check (CRC)), forward error correction (FEC), and retransmission (e.g., automatic repeat request (ARQ)). HARQ may improve throughput at the MAC layer in poor radio conditions (e.g., signal-to-noise conditions). In some cases, a wireless device may support same-slot HARQ feedback, where the device may provide HARQ feedback in a specific slot for data received in a previous symbol in the slot. In other cases, the device may provide HARQ feedback in a subsequent slot, or according to some other time interval.

Time intervals in LTE or NR may be expressed in multiples of a basic time unit, which may, for example, refer to a sampling period of $T_s=1/30,720,000$ seconds. Time intervals of a communications resource may be organized according to radio frames each having a duration of 10 milliseconds (ms), where the frame period may be expressed as $T_f=307,200$ $T_s$. The radio frames may be identified by a system frame number (SFN) ranging from 0 to 1023. Each frame may include 10 subframes numbered from 0 to 9, and each subframe may have a duration of 1 ms. A subframe may be further divided into 2 slots each having a duration of 0.5 ms, and each slot may contain 6 or 7 modulation symbol periods (e.g., depending on the length of the cyclic prefix prepended to each symbol period). Excluding the cyclic prefix, each symbol period may contain 2048 sampling periods. In some cases, a subframe may be the smallest scheduling unit of the wireless communications system 100, and may be referred to as a transmission time interval (TTI). In other cases, a smallest scheduling unit of the wireless communications system 100 may be shorter than a subframe or may be dynamically selected (e.g., in bursts of shortened TTIs (sTTIs) or in selected component carriers using sTTIs).

In some wireless communications systems, a slot may further be divided into multiple mini-slots containing one or more symbols. In some instances, a symbol of a mini-slot or a mini-slot may be the smallest unit of scheduling. Each symbol may vary in duration depending on the subcarrier spacing or frequency band of operation, for example. Further, some wireless communications systems may implement slot aggregation in which multiple slots or mini-slots are aggregated together and used for communication between a UE 115 and a base station 105.

The term "carrier" refers to a set of radio frequency spectrum resources having a defined physical layer structure for supporting communications over a communication link 125. For example, a carrier of a communication link 125 may include a portion of a radio frequency spectrum band that is operated according to physical layer channels for a given radio access technology. Each physical layer channel may carry user data, control information, or other signaling. A carrier may be associated with a pre-defined frequency channel (e.g., an evolved universal mobile telecommunication system terrestrial radio access (E-UTRA) absolute radio frequency channel number (EARFCN)), and may be positioned according to a channel raster for discovery by UEs 115. Carriers may be downlink or uplink (e.g., in an FDD mode), or be configured to carry downlink and uplink communications (e.g., in a TDD mode). In some examples, signal waveforms transmitted over a carrier may be made up of multiple sub-carriers (e.g., using multi-carrier modulation (MCM) techniques such as orthogonal frequency division multiplexing (OFDM) or discrete Fourier transform spread OFDM (DFT-S-OFDM)).

The organizational structure of the carriers may be different for different radio access technologies (e.g., LTE, LTE-A, LTE-A Pro, NR). For example, communications over a carrier may be organized according to TTIs or slots, each of which may include user data as well as control information or signaling to support decoding the user data. A carrier may also include dedicated acquisition signaling (e.g., synchronization signals or system information, etc.) and control signaling that coordinates operation for the carrier. In some examples (e.g., in a carrier aggregation configuration), a carrier may also have acquisition signaling or control signaling that coordinates operations for other carriers.

Physical channels may be multiplexed on a carrier according to various techniques. A physical control channel and a physical data channel may be multiplexed on a downlink carrier, for example, using time division multiplexing (TDM) techniques, frequency division multiplexing (FDM) techniques, or hybrid TDM-FDM techniques. In some examples, control information transmitted in a physical control channel may be distributed between different control regions in a cascaded manner (e.g., between a common control region or common search space and one or more UE-specific control regions or UE-specific search spaces).

A carrier may be associated with a particular bandwidth of the radio frequency spectrum, and in some examples the carrier bandwidth may be referred to as a "system bandwidth" of the carrier or the wireless communications system 100. For example, the carrier bandwidth may be one of a number of predetermined bandwidths for carriers of a particular radio access technology (e.g., 1.4, 3, 5, 10, 15, 20, 40, or 80 MHz). In some examples, each served UE 115 may be configured for operating over portions or all of the carrier bandwidth. In other examples, some UEs 115 may be configured for operation using a narrowband protocol type that is associated with a predefined portion or range (e.g., set of subcarriers or RBs) within a carrier (e.g., "in-band" deployment of a narrowband protocol type).

In a system employing MCM techniques, a resource element may include one symbol period (e.g., a duration of one modulation symbol) and one subcarrier, where the symbol period and subcarrier spacing are inversely related. The number of bits carried by each resource element may depend on the modulation scheme (e.g., the order of the modulation scheme). Thus, the more resource elements that a UE 115 receives and the higher the order of the modulation scheme, the higher the data rate may be for the UE 115. In MIMO systems, a wireless communications resource may refer to a combination of a radio frequency spectrum resource, a time resource, and a spatial resource (e.g., spatial layers), and the use of multiple spatial layers may further increase the data rate for communications with a UE 115.

Devices of the wireless communications system 100 (e.g., base stations 105 or UEs 115) may have a hardware configuration that supports communications over a particular carrier bandwidth, or may be configurable to support communications over one of a set of carrier bandwidths. In some examples, the wireless communications system 100 may include base stations 105 and/or UEs 115 that support simultaneous communications via carriers associated with more than one different carrier bandwidth.

Wireless communications system 100 may support communication with a UE 115 on multiple cells or carriers, a feature which may be referred to as carrier aggregation or multi-carrier operation. A UE 115 may be configured with multiple downlink component carriers and one or more uplink component carriers according to a carrier aggregation configuration. Carrier aggregation may be used with both FDD and TDD component carriers.

In some cases, wireless communications system 100 may utilize enhanced component carriers (eCCs). An eCC may be characterized by one or more features including wider carrier or frequency channel bandwidth, shorter symbol duration, shorter TTI duration, or modified control channel configuration. In some cases, an eCC may be associated with a carrier aggregation configuration or a dual connectivity configuration (e.g., when multiple serving cells have a suboptimal or non-ideal backhaul link). An eCC may also be configured for use in unlicensed spectrum or shared spectrum (e.g., where more than one operator is allowed to use the spectrum). An eCC characterized by wide carrier bandwidth may include one or more segments that may be utilized by UEs 115 that are not capable of monitoring the whole carrier bandwidth or are otherwise configured to use a limited carrier bandwidth (e.g., to conserve power).

In some cases, an eCC may utilize a different symbol duration than other component carriers, which may include use of a reduced symbol duration as compared with symbol durations of the other component carriers. A shorter symbol duration may be associated with increased spacing between adjacent subcarriers. A device, such as a UE 115 or base station 105, utilizing eCCs may transmit wideband signals (e.g., according to frequency channel or carrier bandwidths of 20, 40, 60, 80 MHz, etc.) at reduced symbol durations (e.g., 16.67 microseconds). A TTI in eCC may include one or multiple symbol periods. In some cases, the TTI duration (that is, the number of symbol periods in a TTI) may be variable.

Wireless communications system 100 may be an NR system that may utilize any combination of licensed, shared, and unlicensed spectrum bands, among others. The flexibility of eCC symbol duration and subcarrier spacing may allow for the use of eCC across multiple spectrums. In some examples, NR shared spectrum may increase spectrum utilization and spectral efficiency, specifically through dynamic vertical (e.g., across the frequency domain) and horizontal (e.g., across the time domain) sharing of resources.

UEs 115 may include a communications manager (e.g., communications manager 515 of FIG. 5) capable of controlling or operating UE wireless communications. The communications manager can be configured to perform one or more operations for PBCH decoding with payload change detection. For example, at least one of the UEs 115, via or in conjunction with a communications manager, may sample master information block broadcasts from one of base stations 105 to obtain a first set of samples associated with a first set of one or more prior target transmission time interval (TTI) and a second set of samples associated with a current TTI. In some cases, at least one of UEs 115 may identify a payload change in the master information block broadcasts between the first set of one or more prior TTIs and the current TTI based at least in part on a comparison between the first set of samples and the second set of samples. In some cases, at least one of UEs 115 may modify the first set of samples based at least in part on the identified payload change and decode a master information block based at least in part on a combination of the modified first set of samples and the second set of samples.

Figure 2:
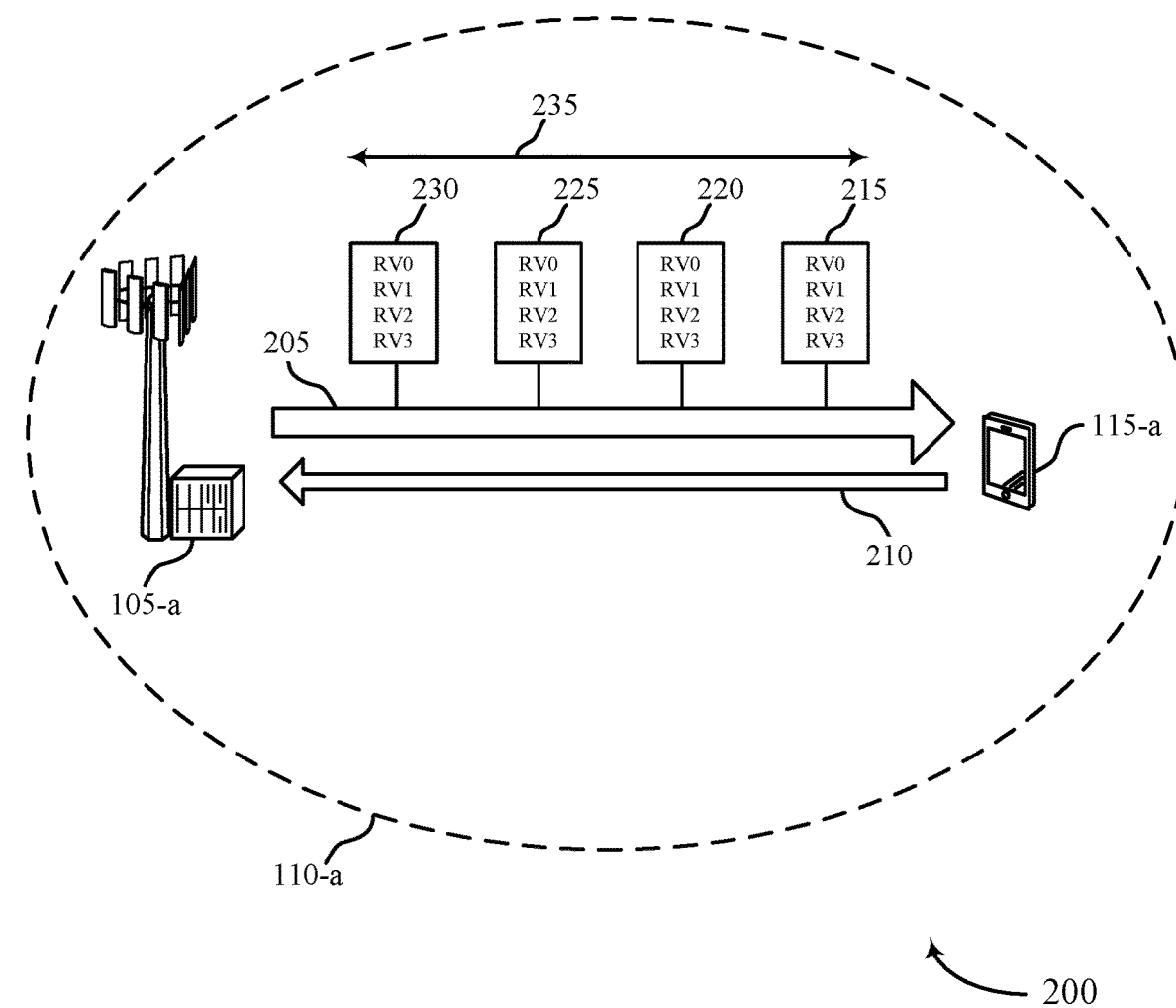
FIG. 2 illustrates an example of a wireless communication subsystem that supports PBCH decoding with payload change detection in accordance with aspects of the present disclosure.

FIG. 2 illustrates an example of a wireless communications subsystem 200 that supports PBCH decoding with payload change detection in accordance with aspects of the present disclosure. In some examples, wireless communications subsystem 200 may implement aspects of wireless communications system 100.

As illustrated, wireless communications subsystem 200 may include UE 115-a and base station 105-a, which may be examples of a UE 115 or a base station 105, as described above with reference to FIG. 1. Wireless communications subsystem 200 may also support downlink 205 and uplink 210 transmissions between base station 105-a and UE 115-a. Base station 105-a may use downlink 205 to convey control and/or data information to UE 115-a. And UE 115-a may use uplink 210 to convey control and/or data information to base station 105-a. In some cases, downlink 205 may use different time and/or frequency resources than uplink 210.

In one example, base station 105-a may use a physical broadcast channel (PBCH) to broadcast a master information block (MIB) to one or more UEs (e.g., at least UE 115-a). In some cases, the MIB may be include 8 bits of a 10-bit system frame number (SFN), 3 bits to indicate system bandwidth, 3 bits to indicate a configuration of a physical hybrid acknowledgements indicator channel, 5 bits for scheduling information (e.g., scheduling information for enhanced machine type communication (eMTC) or narrowband internet of things (NB-IoT), etc.), and 5 reserved bits for a total of 24 bits in the MIB. In one example, base station 105-a may send different redundancy versions (RVs) of a MIB multiple times within a given transmission time interval (TTI). In one example, base station 105-a may transmit the MIB a certain times within a set TTI time period (e.g., four times within a TTI of 40 ms, etc.). For instance, base station 105-a may transmit the MIB four times within a TTI, or every 10 ms within a TTI of 40 ms. In some cases, each RV may have its own scrambling code. In some examples, UE 115-a may decode one RV, where the RV includes 8 bits of the 10-bit SFN, but detect the entire 10 bits of the SFN in the decoded RV based on the scrambling code used for that RV.

In one example, the transmission of a MIB may include 40 bits, where the MIB includes 24 bits and the 16 remaining bits are used for cyclic redundancy check (CRC) bits. In some cases, the transmission may be encoded by a rate 1/3 Tail Biting Convolutional encoder. In one example, base station 105-a may be configured for communication with eMTC-enabled devices. In one example, UE 115-a may be an eMTC-enabled device. In some cases, when PBCH repetition is enabled, base station 105-a may repeat each RV a certain amount of times (e.g., five times, etc.) within a given TTI instead of one time for each RV within the TTI.

In some examples, the SFN of each RV in a given TTI may be incremented by 1, while the rest of the MIB payload remains the same for each of the RVs in that TTI. In some cases, between two consecutive TTIs the SFN part of the payload (e.g., PBCH coded bits) can change only by one of eight possibilities (e.g., in terms of bit-wise XOR operation). In one example, the eight possibilities for the change in eight SFN bits transmitted by base station 105-a are 00000001, 00000011, 00000111, 00001111, 00011111, 00111111, 01111111, 11111111.

As shown, base station 105-a may generate a first MIB and send the first MIB in a first set of four transmissions 215 with four different RVs to UE 115-a. As an example, the change in 8 transmitted bits of the SFN at the first set of transmissions 215 may be 00000001. Subsequently, base station 105-a may send four redundancy versions of the second MIB in a set of transmissions 220 to UE 115-a. In the example, the change in SFN payload at the second set of transmissions 220 may be 00000011, or incremented by one from the previous SFN. Base station 105-a may then send four redundancy versions of the third MIB in a third set of transmissions 225 to UE 115-a (e.g., with change in SFN 00000111), and then send four redundancy versions of the fourth MIB in a fourth set of transmissions 230 to UE 115-a (e.g., with change in SFN 00001111). In some cases, base station 105-a may send the transmissions 215-230 within four TTIs 235. In one example, four TTIs 235 may be 160 ms with 40 ms duration for each TTI. In one example, within four TTIs 235, base station 105-a may send the first set of transmissions 215, then 40 ms later send the second set of transmissions 220, then 40 ms later send the third set of transmissions 225, and then 40 ms later send the fourth set of transmissions 230. Each set of transmission within a 40 ms TTI may include transmissions of four different RVs spaced 10 ms apart.

In some examples, UE 115-a may store samples of multiple MIB transmissions from base station 105-a in one or more buffers of UE 115-a. These samples may include representations (e.g., bit level) of data transmissions. In some examples, the samples can include log-likelihood ratios (LLRs) of the different MIB transmissions. In some cases, UE 115-a may decode the physical broadcast channel based on descrambling and decoding at least one of the MIBs received from base station 105-a. UE 115-a may decode one of the received MIBs to identify certain data included in the decoded MIB (e.g., system bandwidth, scheduling information, complete 10-bit SFN based on the descrambling code used to descramble the MIB, etc.). In some cases decoding each MIB separately and independently may induce significant delays. However, these delays may be mitigated by combining samples across TTIs (e.g., combining LLRs across TTIs, etc.). With a conventional system, combining samples of MIBs across two different TTIs is not possible. However, with the current techniques samples may be combined across two or more TTIs (e.g., a current TTI and at least one previous TTI). For example, the current techniques may include configuring UE 115-a to detect a change in payload in the transmitted MIBs, combine samples based at least in part on the detected change in payload, and decode the payloads based at least in part on the combined samples.

Figure 3:
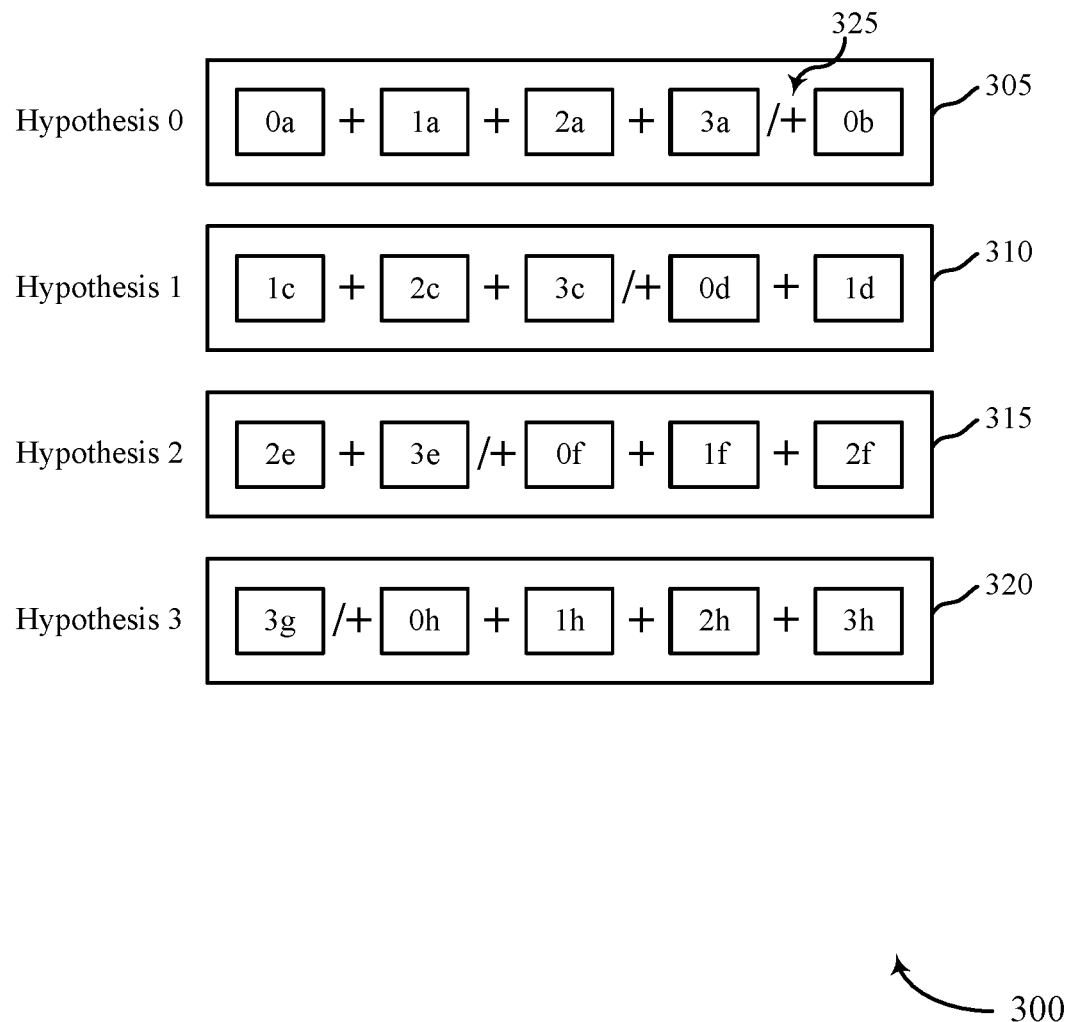
FIG. 3 illustrates an example of a buffer system that supports PBCH decoding with payload change detection in accordance with aspects of the present disclosure.

FIG. 3 illustrates an example of a buffer system 300 that supports PBCH decoding with payload change detection in accordance with aspects of the present disclosure. In some examples, buffer system 300 may implement aspects of wireless communications system 100. In some cases, buffer system 300 may include multiple buffers of a UE (e.g., UEs 115). In some examples, buffer system 300 may implement aspects of wireless communications system 100

In the illustrated example, buffer system 300 includes first buffer 305, second buffer 310, third buffer 315, and fourth buffer 320. In some cases, buffer system 300 may include less or more buffers. In some cases, a UE may form a hypothesis that is based on the UE hypothesizing on information about the operating mode of a base station (e.g., base station 105 of FIGS. 1 and/or 2) and attempting to decode PBCH based on the hypothesized information. As shown, first buffer 305 may be associated with a first hypothesis (e.g., Hypothesis 0), second buffer 310 may be associated with a second hypothesis (e.g., Hypothesis 1), third buffer 315 may be associated with a third hypothesis (e.g., Hypothesis 2), and fourth buffer 320 may be associated with a fourth hypothesis (e.g., Hypothesis 3). In some examples, each buffer 305, 310, 315, 320 may store the same samples at the same positions, with each hypothesis representing a different possible TTI boundary. That is, under Hypothesis 0, the MIB samples stored in the first four positions of the first buffer 305 are assumed to correspond to different RVs of the same MIB of the same TTI, and the MIB samples stored in the fifth is assumed to correspond to a different TTI. Similarly, the TTI boundary is hypothesized to occur between the third and fourth positions of the second buffer 310 under Hypothesis 1, between the second and third positions of the third buffer 315 under Hypothesis 2, and between the first and second positions of the fourth buffer 320 under Hypothesis 3.

In some cases, a UE may be configured to combine samples across MIB 0a, MIB 1a, MIB 2a, and MIB 3a received over TTI-a to improve PBCH decoding. Similarly, a UE may be configured to combine samples from MIB 0b, MIB 1b, MIB 2b, and MIB 3b received over TTI-b to improve PBCH decoding. However, combining samples between MIB 3a and MIB 0b at the transition 325 is not possible in a conventional system because the payload gets changed after transition 325. However, based on the present techniques a UE may be configured to combine samples between MIB 3a and MIB 0b at the transition 325.

Figure 4:
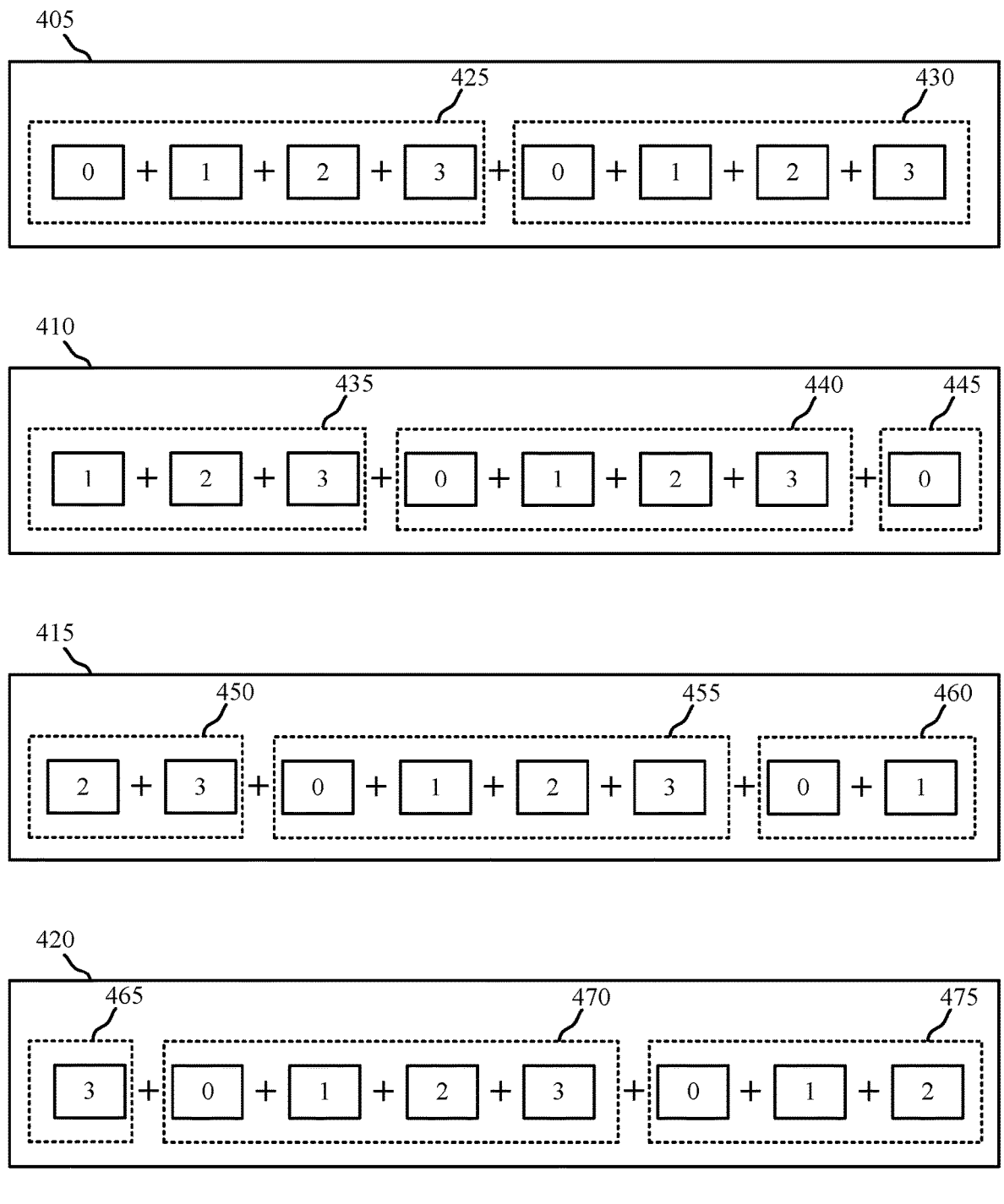
FIG. 4 illustrates an example of a buffer system that supports PBCH decoding with payload change detection in accordance with aspects of the present disclosure.

FIG. 4 illustrates an example of a buffer system 400 that supports PBCH decoding with payload change detection in accordance with aspects of the present disclosure. In some examples, buffer system 400 may implement aspects of wireless communications system 100. In some cases, buffer system 400 may include multiple buffers of a UE (e.g., UEs 115). In some cases, buffer system 400 may be an example of buffer system 300.

As illustrated, buffer system 300 can comprise one or more buffers. These buffers may include first buffer 405, second buffer 410, third buffer 415, and fourth buffer 420. As shown, first buffer 405 may include a first set of MIBs 425 received over a first TTI and a second set of MIBs 430 received over a second TTI. Similarly, second buffer 410 may include a third set of MIBs 435 received over the first TTI, a fourth set of MIBs 440 received over the second TTI, and a fifth set of MIBs 445 received over a third TTI. As shown, third buffer 415 may include a sixth set of MIBs 450 received over the first TTI, seventh set of MIBs 455 received over the second TTI, and eight set of MIBs 460 received over the third TTI. Also shown, fourth buffer 420 may include a ninth set of MIBs 465 received over the first TTI, tenth set of MIBs 470 received over the second TTI, and eleventh set of MIBs 475 received over the third TTI.

In one example, a UE may be configured to combine samples from multiple MIBs. For example, a UE can combine samples taken across the first set of MIBs 425 and combine samples across the second set of MIBs 430. By combining the samples, the UE can utilize the combined samples to improve PBCH decoding (e.g., reducing PBCH decoding time). Additionally, the UE may be configured to combine samples between the first set of MIBs 425 and the second set of MIBs 430. For example, the UE may combine a sample of a MIB from the first set of MIBs 425 with a sample of a MIB from the second set of MIBs 430. Additionally or alternatively, the UE may be configured to combine samples across the third set of MIBs 435, combine samples across the fourth set of MIBs 440, and combine samples across the fifth set of MIBs 445. Additionally, the UE may be configured to combine samples between the third set of MIBs 435 and the fourth set of MIBs 440, and/or combine samples between the fourth set of MIBs 440 and the fifth set of MIBs 445. For example, the UE may combine a sample of a MIB from the third set of MIBs 435 with a sample of a MIB from the fourth set of MIBs 440. Additionally or alternatively, the UE may combine a sample of a MIB from the fourth set of MIBs 440 with a sample of a MIB from the fifth set of MIBs 445.

In some examples, a UE may detect a change in a PBCH payload (e.g., one out of the eight possibilities) more reliably than decoding the PBCH payload. In some cases, UE may detect a change in a PBCH payload from one or more samples of the PBCH payload (e.g., log likelihood ratio (LLR), etc.) of a current TTI and one or more previous TTIs. As one example, at a −16 dB signal to noise ratio (SNR), change in PBCH payload may be detected with a 92% decoding probability from a current TTI and a previous TTI. In the same example, change in PBCH payload may be detected with a 99% decoding probability from a current TTI and two previous TTIs. In contrast, PBCH decoding probability at −16 dB SNR may be as high as only 5%.

As used in the present disclosure, the term "hard decision" refers to a decision in which each bit is considered to be definitely a one or a zero. "Hard metrics" refer to the individual one or zero values determined for each bit.

As used in the present disclosure, the term "soft decision" refers to a decision in which each bit is considered to be a one or a zero with an indication of certainty. "Soft metrics" refer to the individual one or zero values and levels of certainty determined for each bit.

In some cases, a UE may obtain soft metrics and/or hard metrics for one or more samples. For example, a UE may identify a plurality of possible payload changes and determine a probability value for each possible payload change. In some examples, a UE may modify combined samples (e.g., LLRs) from at least one previous TTI based on the soft metrics or hard metrics for the detected change in the payload. In one example, a message may be transmitted to a UE. The UE may include a hard decision decoder and a soft decision decoder. In the example, a binary "0" may be transmitted as 0 Volts and a binary "1" may be transmitted as 1 Volt in a voltage waveform. In some cases, the hard decision decoder may output hard metrics or hard bit values, while the soft decision decoder may output soft metrics or soft bit values. In some cases, the hard decision decoder and/or soft decision decoder may receive a voltage waveform representing the input signal received by the UE. In some cases, the voltage waveform may be synchronized with a clock of the UE. In one example, the threshold voltage may be 0.5 Volts. Accordingly, at each sampling instance (e.g., determined by the synchronized clock), the hard decision detector may determine the state of a measured voltage value to be a binary "0" when the sampled voltage level falls below the threshold and a binary "1" when the sampled voltage level is above the threshold. Based on this comparison, the hard decision decoder may generate a codeword output (e.g., a codeword of binary values). In some cases, a decoder may compare the codeword output of the hard decision detector with the all possible codewords and computes a minimum Hamming distance between the codeword output and each possible codeword, where the Hamming distance between two codewords is the count of number of bits that are different in the two codewords. In some cases, the codeword output may be compared with the all possible codewords and the codeword which gives the minimum Hamming distance to the codeword output may be selected as the most likely value of the received message, or the hard metric.

In some examples, a soft decision decoder may analyze a received voltage waveform and make a soft decision based on the analysis. Similar to the hard decision decoder, the soft decision decoder may analyze a voltage waveform and output a codeword. In some cases, the soft decision decoder may compare the codeword output with the all possible codewords. However, instead of using Hamming distance, the soft decision decoder may use a Euclidean distance in the comparison (e.g., a straight-line distance between two points, log-likelihood ratio, etc.). Accordingly, the soft decision decoder may compare the codeword output with the all possible codewords and the possible codeword that gives the minimum Euclidean distance to the codeword output may be selected as the most likely value of the received message, or the soft metric. Thus the soft decision decoding provides additional reliability information based on a calculated Euclidean distance or calculated log-likelihood ratio.

In one example, the second set of MIBs 430 may be received over a current TTI and the first set of MIBs 425 may be received over a previous TTI. Accordingly, the UE may obtain soft metrics and/or hard metrics for a detected change in payload from samples of the first set of MIBs 425 and samples of the second set of MIBs 430. In the same example or in a separate example, the fifth set of MIBs 445 may be received over a current TTI, while the fourth set of MIBs 440 may be received over a first previous TTI before the current TTI, and the third set of MIBs 435 may be received over a second previous TTI before the first previous TTI and the current TTI. Accordingly, the UE may obtain soft metrics and/or hard metrics for a detected change in payload from samples of the fifth set of MIBs 445 and samples of the fourth set of MIBs 440, and/or obtain soft metrics and/or hard metrics for a detected change in payload from samples of the fourth set of MIBs 440 and samples of the third set of MIBs 435.

In one example, a UE may obtain soft metrics for a first set of samples from the first set of MIBs 425 and a second set of samples from the second set of MIBs 430. This can be done by identifying a plurality of possible payload changes in the samples and determining a probability value for each possible payload change (e.g., a probability value for each of 8 possible payload changes). In another example, a UE may obtain hard metrics for a first set of samples from the first set of MIBs 425 and a second set of samples from the second set of MIBs 430 by identifying a plurality of possible payload changes between the samples and selecting a most likely payload change from the plurality of possible payload changes (e.g., selecting one of the 8 possible payload changes as the most likely payload change).

In some examples, a detected change in MIB payload may be denoted as k. In some cases, the payload change may be detected by observing samples (e.g., LLRs) from current and one or more previous TTIs. The UE may then find a corresponding change in coded bits between ith TTI and the (i−1)th TTIs. The coded bits corresponding to the change in payload may be denoted as δk(i), where "i" denotes the TTI (e.g., where TTI "i" may be the current TTI, etc.). In some cases, computing soft metrics for the detected change in MIB payloads may include observing samples (e.g., LLRs) from current and previous TTIs, denoted as s(k), for k∈{1, 2, . . . , 8}, where the UE identifies the 8 corresponding changes in coded bits between ith and (i−1)th TTIs, based on the corresponding change in coded bits δk(i).

In one example, a UE may analyze samples (e.g., LLRs) from a first set of samples from the first set of MIBs 425 and a second set of samples from the second set of MIBs 430. In doing so, a UE can use the analyzation results to find corresponding change in coded bits (e.g., δk(i)) between the second set of MIBs 430 received over a current TTI (e.g., ith TTI) and the first set of MIBs 425 received over a previous TTI (e.g., (i−1)th TTI). In some cases, the UE may compute hard metrics for the first set of samples from the first set of MIBs 425 and the second set of samples from the second set of MIBs 430. Alternatively, the UE may compute soft metrics for the first set of samples from the first set of MIBs 425 and the second set of samples from the second set of MIBs 430. In some cases, the UE may compute hard metrics for a first set of samples of a set of MIBs received over a current TTI (e.g., fifth set of MIBs 445), a second set of samples of a set of MIBs received over a first previous TTI (e.g., fourth set of MIBs 440), and a third set of samples of a set of MIBs received over a second previous TTI (e.g., third set of MIBs 435), and find the corresponding change in coded bits (e.g., δk(i)) between the relative ith and (i−1)th TTIs, where in one iteration the "ith" TTI refers to the current TTI and (i−1)th TTI refers to the first previous TTI, and in another iteration the "ith" TTI refers to the first previous TTI and (i−1)th TTI refers to the second previous TTI, and so on.

In an example where samples include LLRs, a UE may combine the LLRs from a previous TTI (e.g., first previous TTI in relation to a current TTI, and/or second previous TTI in relation to the first previous TTI, etc.). In some examples, the combined LLRs may be denoted as $LLR_{comb}(i-1)$. In some cases, the UE may modify the combined LLRs from the previous TTI based on the respective soft/hard metrics computed for the detected changes in payload. In some cases, the modification may include the UE perform a flip operation on the combined samples from the previous TTI. For example, the UE may identify those places where the corresponding coded bits δk(i) has a value of 1 (indicating a change in the payload occurred at those places). The UE may then perform the flip operation at those places where δk(i) has a value of 1. For example, the UE may flip the sign of the LLR for the combined LLR from the previous TTI (e.g., $LLR_{comb}(i-1)$) at those identified places where δk(i) has a value of 1. For hard metrics, the computation of the modified combined LLRs may be denoted as $LLR'_{comb}(i)=\text{Flip}(LLR_{comb}(i-1),\delta k(i))$. For soft metrics, the computation of the modified combined LLRs may be denoted as $LLR'_{comb}(i)=\Sigma s(k)\text{Flip}(LLR_{comb}(i-1),\delta k(i))$.

In some cases, modifying the combined LLRs from the previous TTI may enable the UE to combine the LLRs from the previous TTI with the LLRs from the current TTI. Accordingly, in some cases the UE may add the uncombined LLRs from the current TTI (e.g., LLR(i)) to the combined LLR from the previous TTI (e.g., $LLR_{comb}(i-1)$) to get the overall combined LLRs between the two TTIs.

In some cases, a UE may compute soft metrics or hard metrics based at least in part on observed probabilities of the change in payload. As an example, for changes in the SFN portion of the payload, a payload change of 00000001 may occur with a probability of 0.5 (e.g., 50%), while a payload change of 000000011 may occur with a probability of 0.25 (e.g., 25%) based on prior observation. For example, a UE may obtain soft metrics for a set of samples by identifying a plurality of possible payload changes and determining a probability value for each possible payload change. In some cases, determining the probability value for each possible payload change may be based at least in part on the observed probabilities of the change in payload. Similarly, a UE may obtain hard metrics for a set of samples by identifying a plurality of possible payload changes and selecting a most likely payload change from the plurality of possible payload changes. In some cases, selecting the most likely payload change may be based at least in part on the observed probabilities of the change in payload.

In some cases, a UE may detect the change in payload between current and one or more previous TTIs. Detection can be based at least in part on continuously combining samples or LLRs across TTIs. In some cases, detection may be performed in conjunction with one or more processors, software executed by the one or more processors, and/or memory of the UE. In some cases, detection may be performed by a communications manager (e.g., communications manager 515 of FIG. 5). However, in some cases a UE may stop detecting the change in payload between TTIs and/or stop combining LLRs across TTIs when decoding does not succeed before a predetermined time period lapses.

Figure 5:
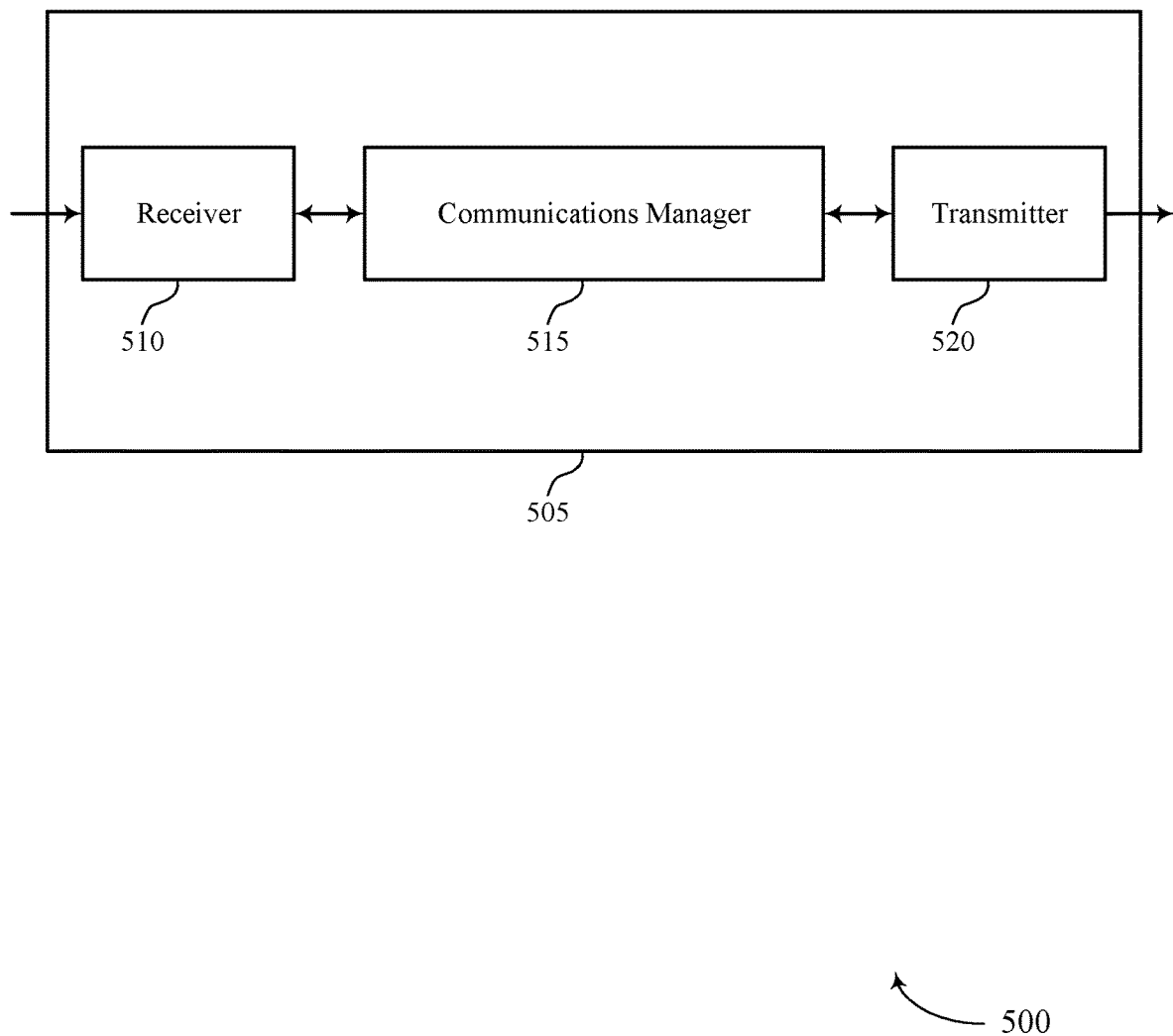
FIGS. 5 and 6 show block diagrams of devices that support PBCH decoding with payload change detection in accordance with aspects of the present disclosure.

FIG. 5 shows a block diagram 500 of a device 505 that supports PBCH decoding with payload change detection in accordance with aspects of the present disclosure. The device 505 may be an example of aspects of a UE 115 as described herein. The device 505 may include a receiver 510, a communications manager 515, and a transmitter 520. The device 505 may also include a processor. Each of these components may be in communication with one another (e.g., via one or more buses). In some cases, one or more managers and/or sub-managers (e.g., communications manager 515, sub-managers of communications manager 515, etc.) may include or perform one or more operations described herein in conjunction with at least one of firmware, hardware (e.g., one or more processors, memory, etc.), software (e.g., software code executable by a processor of communications manager 515 or another processor), or any combination thereof.

The receiver 510 may receive information such as packets, user data, or control information associated with various information channels (e.g., control channels, data channels, and information related to PBCH decoding with payload change detection, etc.). Information may be passed on to other components of the device 505. The receiver 510 may be an example of aspects of the transceiver 820 described with reference to FIG. 8. The receiver 510 may utilize a single antenna or a set of antennas.

The communications manager 515 may monitor a set of master information block broadcasts from a base station. While monitoring broadcasts, the communications manager 515 can obtain a first set of samples associated with a first set of one or more prior target transmission time interval (TTI) and a second set of samples associated with a current TTI, identify a payload change in the master information block broadcasts between the first set of one or more prior TTIs and the current TTI based on a comparison between the first set of samples and the second set of samples, modify the first set of samples based on the identified payload change, and decode a master information block based on a combination of the modified first set of samples and the second set of samples. The communications manager 515 may be an example of aspects of the communications manager 810 described herein.

The communications manager 515 can comprise a number of components and be implemented in a variety of manners. For example, the communications manager 515, or its sub-components, may be implemented in hardware, code (e.g., software or firmware) executed by a processor, or any combination thereof. If implemented in code executed by a processor, the functions of the communications manager 515, or its sub-components may be executed by a general-purpose processor, a DSP, an application-specific integrated circuit (ASIC), a FPGA or other programmable logic device, discrete gate or transistor logic, discrete hardware components, or any combination thereof designed to perform the functions described in the present disclosure.

The communications manager 515, or its sub-components, may be physically located at various positions, including being distributed such that portions of functions are implemented at different physical locations by one or more physical components. In some examples, the communications manager 515, or its sub-components, may be a separate and distinct component in accordance with various aspects of the present disclosure. In some examples, the communications manager 515, or its sub-components, may be combined with one or more other hardware components, including but not limited to an input/output (I/O) component, a transceiver, a network server, another computing device, one or more other components described in the present disclosure, or a combination thereof in accordance with various aspects of the present disclosure.

The transmitter 520 may transmit signals generated by other components of the device 505. In some examples, the transmitter 520 may be collocated with a receiver 510 in a transceiver module. For example, the transmitter 520 may be an example of aspects of the transceiver 820 described with reference to FIG. 8. The transmitter 520 may utilize a single antenna or a set of antennas.

Figure 6:
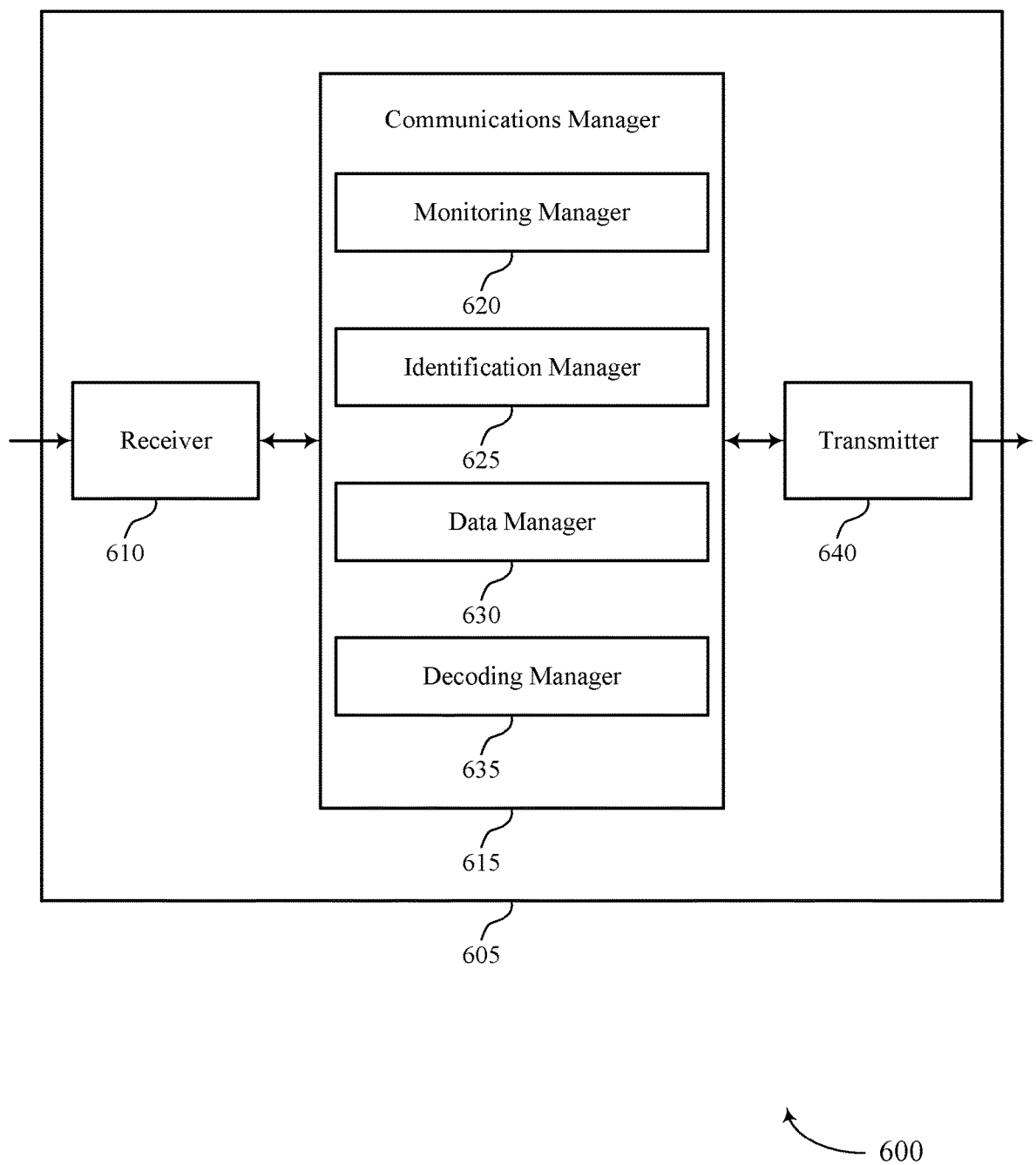

FIG. 6 shows a block diagram 600 of a device 605 that supports PBCH decoding with payload change detection in accordance with aspects of the present disclosure. The device 605 may be an example of aspects of a device 505, or a UE 115 as described herein. The device 605 may include a receiver 610, a communications manager 615, and a transmitter 640. The device 605 may also include a processor. Each of these components may be in communication with one another (e.g., via one or more buses).

The receiver 610 may receive information such as packets, user data, or control information. These can be associated with various information channels (e.g., control channels, data channels, and information related to PBCH decoding with payload change detection, etc.). Information may be passed on to other components of the device 605. The receiver 610 may be an example of aspects of the transceiver 820 described with reference to FIG. 8. The receiver 610 may utilize a single antenna or a set of antennas.

The communications manager 615 may be an example of aspects of the communications manager 515 as described herein. The communications manager 615 may include a monitoring manager 620, an identification manager 625, a data manager 630, and a decoding manager 635. The communications manager 615 may be an example of aspects of the communications manager 810 described herein. The monitoring manager 620 may monitor a set of master information block broadcasts from a base station to obtain a first set of samples associated with a first set of one or more prior target transmission time interval (TTI) and a second set of samples associated with a current TTI.

The identification manager 625 may identify a payload change in the master information block broadcasts. This identification can occur between the first set of one or more prior TTIs and the current TTI based on a comparison between the first set of samples and the second set of samples. The data manager 630 may modify the first set of samples based on the identified payload change. The decoding manager 635 may decode a master information block based on a combination of the modified first set of samples and the second set of samples.

Each of the managers shown in device 605 may be implemented as special-purpose hardware, as software, or as a combination of hardware and software.

The transmitter 640 may transmit signals generated by other components of the device 605. In some examples, the transmitter 640 may be collocated with a receiver 610 in a transceiver module. For example, the transmitter 640 may be an example of aspects of the transceiver 820 described with reference to FIG. 8. The transmitter 640 may utilize a single antenna or a set of antennas.

Figure 7:
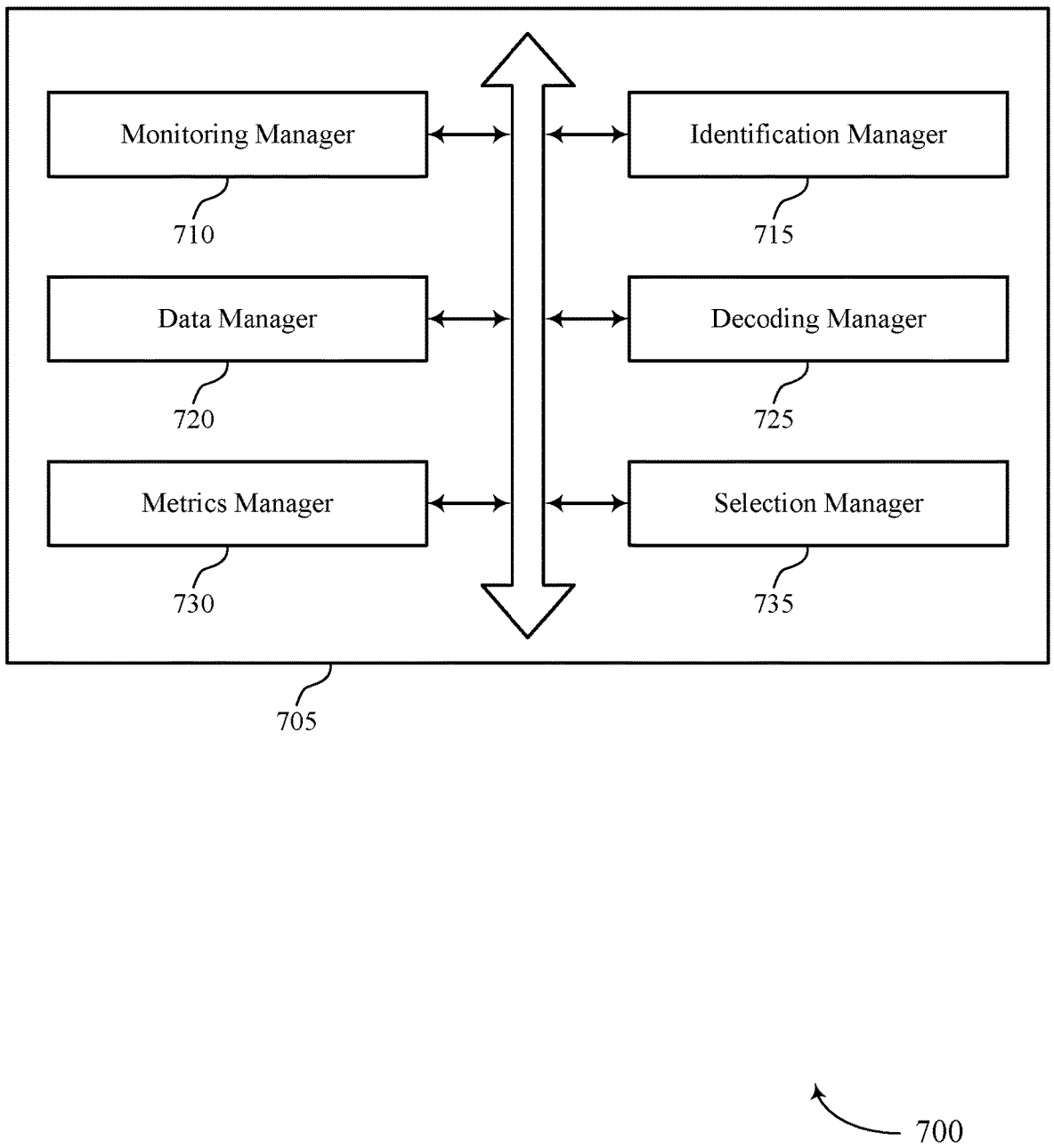
FIG. 7 shows a block diagram of a communications manager that supports PBCH decoding with payload change detection in accordance with aspects of the present disclosure.

FIG. 7 shows a block diagram 700 of a communications manager 705 that supports PBCH decoding with payload change detection in accordance with aspects of the present disclosure. The communications manager 705 may be an example of aspects of a communications manager 515, a communications manager 615, or a communications manager 810 described herein. The communications manager 705 may include a monitoring manager 710, an identification manager 715, a data manager 720, a decoding manager 725, a metrics manager 730, and a selection manager 735. Each of these components may communicate, directly or indirectly, with one another (e.g., via one or more buses).

Each of the components of the communications manager 705 may be implemented as special-purpose hardware, as software, or as a combination of hardware and software.

The monitoring manager 710 may monitor a set of master information block broadcasts from a base station. In doing so, the monitoring manager 710 can obtain a first set of samples associated with a first set of one or more prior target transmission time interval (TTI) and a second set of samples associated with a current TTI.

The identification manager 715 may identify a payload change in the master information block broadcasts. For example, the identification can occur between the first set of one or more prior TTIs and the current TTI based on a comparison between the first set of samples and the second set of samples. In some examples, the identification manager 715 may identify coded bits corresponding to the identified payload change. In some examples, the identification manager 715 may identify the payload change is further based on a probability associated with the selected payload change. In some examples, the identification manager 715 may identify a second payload change between the second prior TTI and the third prior TTI.

The data manager 720 may modify the first set of samples based on the identified payload change. In some examples, the data manager 720 may change a sign of one or more samples in the first set of samples, the one or more samples corresponding to a system frame number. In some examples, the data manager 720 may obtain a third set of samples associated with a second prior TTI. In some examples, the data manager 720 may modify the third set of samples based on the identified second payload change. In some examples, the data manager 720 may abort combining the first set of samples and the second set of samples based on a success of the decoding within a threshold amount of time.

In some cases, the samples can be obtained from various components. These include at least one of a sample from the base station unmodified by a user equipment, a sample from the base station modified by the user equipment, a log likelihood ratios, or any combination thereof. The decoding manager 725 may decode a master information block based on a combination of the modified first set of samples and the second set of samples. In some examples, the decoding manager 725 may decode the master information block is based on a combination of the modified first set of samples, the modified third set of samples, and the second set of samples.

The metrics manager 730 may obtain soft metrics for the first set of samples and the second set of samples. These soft metrics can be obtained by identifying a set of possible payload changes and determining a probability value for each possible payload change. In some examples, the metrics manager 730 may where identifying the payload change is based on the soft metrics obtained for the first set of samples and the second set of samples. In some examples, the metrics manager 730 may obtain hard metrics for the first set of samples and the second set of samples by identifying a set of possible payload changes and selecting a most likely payload change from the set of possible payload changes. In some examples, the metrics manager 730 may where identifying the payload change is based on the hard metrics obtained for the first set of samples and the second set of samples. The selection manager 735 may select the payload change from a fixed set of possible changes in a system frame number between the first set of one or more prior TTIs and the current TTI.

Figure 8:
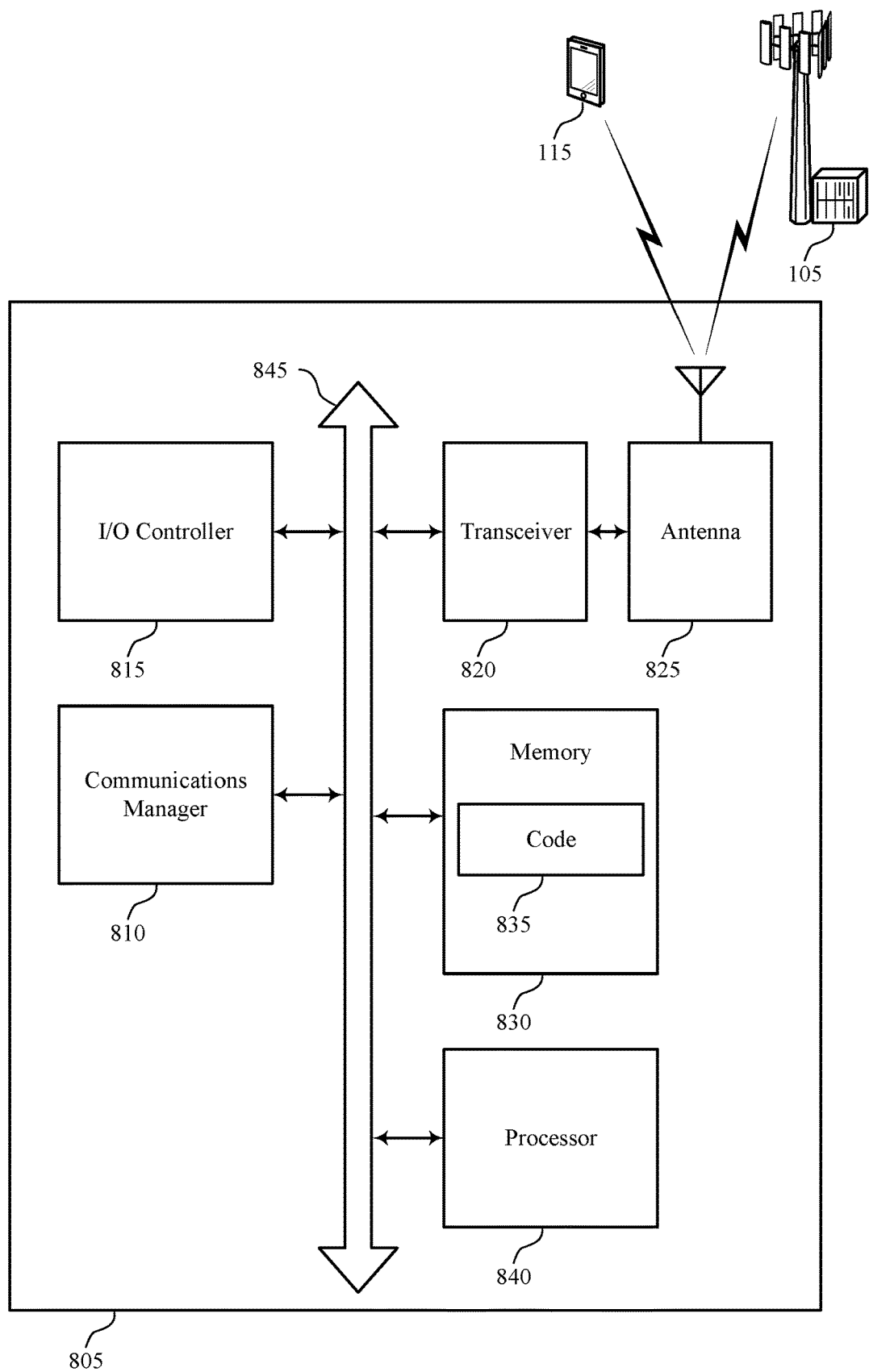
FIG. 8 shows a diagram of a system including a device that supports PBCH decoding with payload change detection in accordance with aspects of the present disclosure.

FIG. 8 shows a diagram of a system 800 including a device 805 that supports PBCH decoding with payload change detection in accordance with aspects of the present disclosure. The device 805 may be an example of or include the components of device 505, device 605, or a UE 115 as described herein. The device 805 may include components for bi-directional voice and data communications including components for transmitting and receiving communications, including a communications manager 810, an I/O controller 815, a transceiver 820, an antenna 825, memory 830, and a processor 840. These components may be in electronic communication via one or more buses (e.g., bus 845).

The communications manager 810 may monitor a set of master information block broadcasts from a base station to obtain a first set of samples associated with a first set of one or more prior target transmission time interval (TTI) and a second set of samples associated with a current TTI, identify a payload change in the master information block broadcasts between the first set of one or more prior TTIs and the current TTI based on a comparison between the first set of samples and the second set of samples, modify the first set of samples based on the identified payload change, and decode a master information block based on a combination of the modified first set of samples and the second set of samples.

The I/O controller 815 may manage input and output signals for the device 805. The I/O controller 815 may also manage peripherals not integrated into the device 805. In some cases, the I/O controller 815 may represent a physical connection or port to an external peripheral. In some cases, the I/O controller 815 may utilize an operating system such as iOS®, ANDROID®, MS-DOS®, MS-WINDOWS®, OS/2®, UNIX®, LINUX®, or another known operating system. In other cases, the I/O controller 815 may represent or interact with a modem, a keyboard, a mouse, a touchscreen, or a similar device. In some cases, the I/O controller 815 may be implemented as part of a processor. In some cases, a user may interact with the device 805 via the I/O controller 815 or via hardware components controlled by the I/O controller 815.

The transceiver 820 may communicate bi-directionally, via one or more antennas, wired, or wireless links as described above. For example, the transceiver 820 may represent a wireless transceiver and may communicate bi-directionally with another wireless transceiver. The transceiver 820 may also include a modem to modulate the packets and provide the modulated packets to the antennas for transmission, and to demodulate packets received from the antennas.

In some cases, the wireless device may include a single antenna 825. However, in some cases the device may have more than one antenna 825, which may be capable of concurrently transmitting or receiving multiple wireless transmissions.

The memory 830 may include RAM and ROM. The memory 830 may store computer-readable, computer-executable code 835 including instructions that, when executed, cause the processor to perform various functions described herein. In some cases, the memory 830 may contain, among other things, a BIOS which may control basic hardware or software operation such as the interaction with peripheral components or devices.

The processor 840 may include an intelligent hardware device, (e.g., a general-purpose processor, a DSP, a CPU, a microcontroller, an ASIC, an FPGA, a programmable logic device, a discrete gate or transistor logic component, a discrete hardware component, or any combination thereof). In some cases, the processor 840 may be configured to operate a memory array using a memory controller. In other cases, a memory controller may be integrated into the processor 840. The processor 840 may be configured to execute computer-readable instructions stored in a memory (e.g., the memory 830) to cause the device 805 to perform various functions (e.g., functions or tasks supporting PBCH decoding with payload change detection).

The code 835 may include instructions to implement aspects of the present disclosure, including instructions to support wireless communications. The code 835 may be stored in a non-transitory computer-readable medium such as system memory or other type of memory. In some cases, the code 835 may not be directly executable by the processor 840 but may cause a computer (e.g., when compiled and executed) to perform functions described herein.

Figure 9:
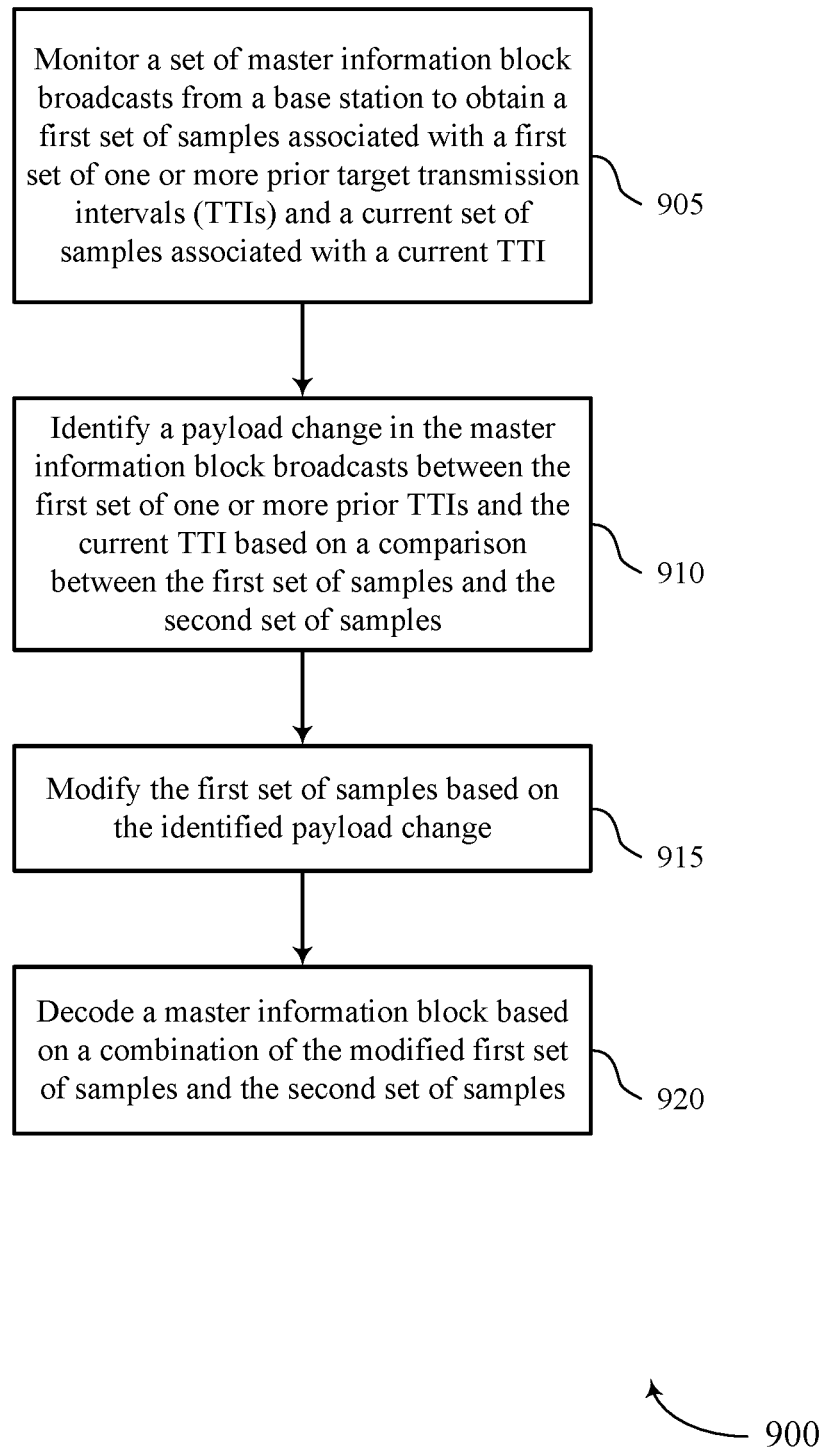
FIGS. 9 and 10 show flowcharts illustrating methods that support PBCH decoding with payload change detection in accordance with aspects of the present disclosure.

FIG. 9 shows a flowchart illustrating a method 900 that supports PBCH decoding with payload change detection in accordance with aspects of the present disclosure. The operations of method 900 may be implemented by a UE 115 or its components as described herein. For example, the operations of method 900 may be performed by a communications manager as described with reference to FIGS. 5 through 8. In some examples, a UE may execute a set of instructions to control the functional elements of the UE to perform the functions described below. Additionally or alternatively, a UE may perform aspects of the functions described below using special-purpose hardware.

At 905, the UE may monitor a set of master information block broadcasts from a base station to obtain a first set of samples associated with a first set of one or more prior target transmission time interval (TTI) and a second set of samples associated with a current TTI. The operations of 905 may be performed according to the methods described herein. In some examples, aspects of the operations of 905 may be performed by a monitoring manager as described with reference to FIGS. 5 through 8.

At 910, the UE may identify a payload change in the master information block broadcasts between the first set of one or more prior TTIs and the current TTI based on a comparison between the first set of samples and the second set of samples. The operations of 910 may be performed according to the methods described herein. In some examples, aspects of the operations of 910 may be performed by an identification manager as described with reference to FIGS. 5 through 8.

At 915, the UE may modify the first set of samples based on the identified payload change. The operations of 915 may be performed according to the methods described herein. In some examples, aspects of the operations of 915 may be performed by a data manager as described with reference to FIGS. 5 through 8.

At 920, the UE may decode a master information block based on a combination of the modified first set of samples and the second set of samples. The operations of 920 may be performed according to the methods described herein. In some examples, aspects of the operations of 920 may be performed by a decoding manager as described with reference to FIGS. 5 through 8.

Figure 10:
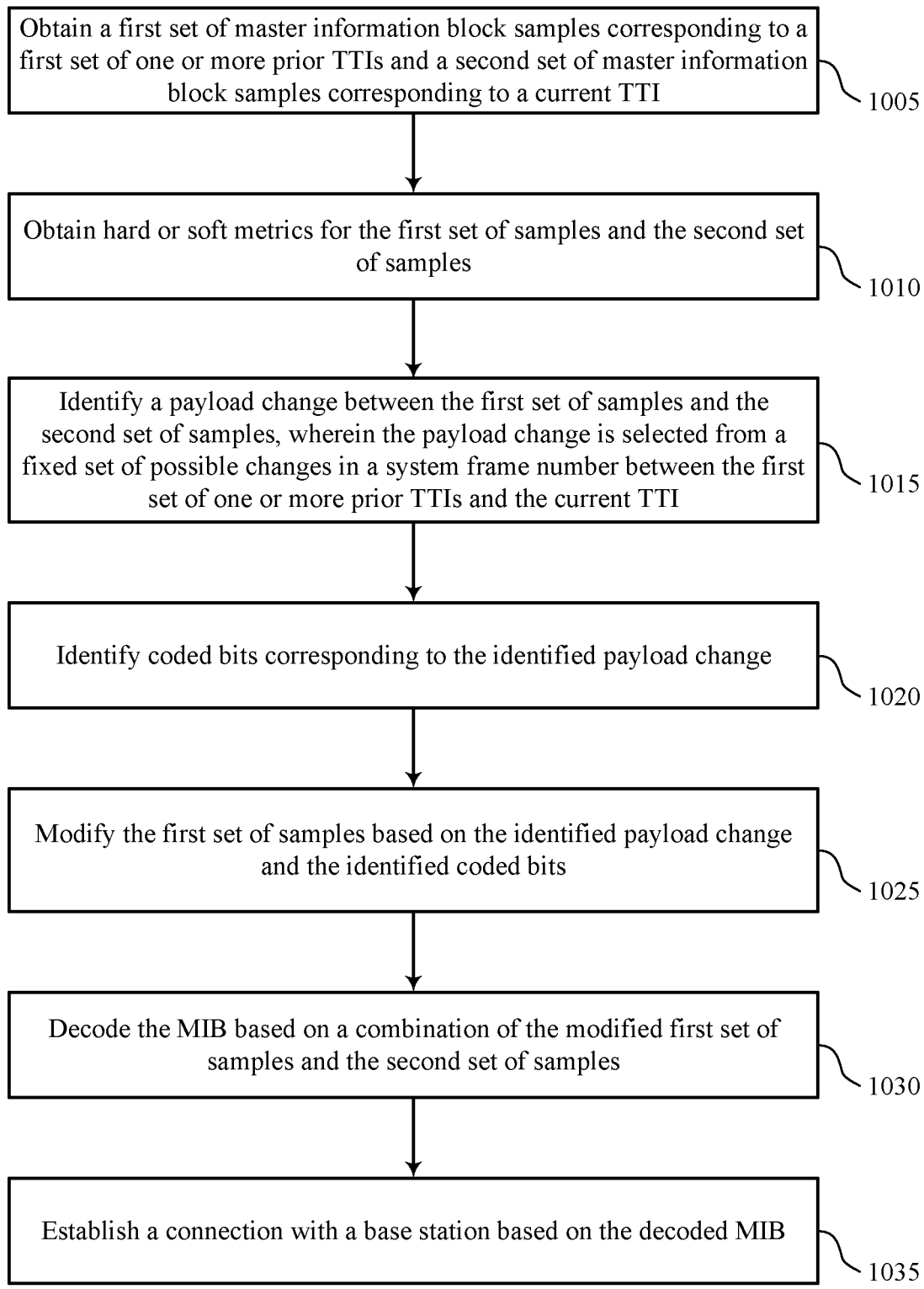

FIG. 10 shows a flowchart illustrating a method 1000 that supports PBCH decoding with payload change detection in accordance with aspects of the present disclosure. The operations of method 1000 may be implemented by a UE 115 or its components as described herein. For example, the operations of method 1000 may be performed by a communications manager as described with reference to FIGS. 5 through 8. In some examples, a UE may execute a set of instructions to control the functional elements of the UE to perform the functions described below. Additionally or alternatively, a UE may perform aspects of the functions described below using special-purpose hardware.

At 1005, a UE may obtain a first set of master information block samples corresponding to a first set of one or more prior TTIs and a second set of master information block samples corresponding to a current TTI. The operations of 1005 may be performed according to the methods described herein. In some examples, aspects of the operations of 1005 may be performed by an monitoring manager as described with reference to FIGS. 5 through 8.

At 1010, the UE may obtain hard or soft metrics for the first set of samples and the second set of samples. In some cases, obtaining soft metrics for the first set of samples and the second set of samples may include identifying a plurality of possible payload changes and determining a probability value for each possible payload change. In some cases, obtaining hard metrics for the first set of samples and the second set of samples by identifying a plurality of possible payload changes and selecting a most likely payload change from the plurality of possible payload changes. The operations of 1010 may be performed according to the methods described herein. In some examples, aspects of the operations of 1010 may be performed by a metrics manager as described with reference to FIGS. 5 through 8.

At 1015, the UE may identify a payload change between the first set of samples and the second set of samples, wherein the payload change is selected from a fixed set of possible changes in a system frame number between the first set of one or more prior TTIs and the current TTI. The operations of 1015 may be performed according to the methods described herein. In some examples, aspects of the operations of 1015 may be performed by an identification manager as described with reference to FIGS. 5 through 8.

At 1020, the UE may identify coded bits corresponding to the identified payload change. The operations of 1020 may be performed according to the methods described herein. In some examples, aspects of the operations of 1020 may be performed by an identification manager as described with reference to FIGS. 5 through 8.

At 1025, the UE may modify the first set of samples based on the identified payload change and the identified coded bits. The operations of 1025 may be performed according to the methods described herein. In some examples, aspects of the operations of 1025 may be performed by a data manager as described with reference to FIGS. 5 through 8.

At 1030, the UE may decode the MIB based on a combination of the modified first set of samples and the second set of samples. The operations of 1030 may be performed according to the methods described herein. In some examples, aspects of the operations of 1030 may be performed by a decoding manager as described with reference to FIGS. 5 through 8.

At 1035, the UE may establish a connection with a base station based on the decoded MIB. The operations of 1035 may be performed according to the methods described herein. In some examples, aspects of the operations of 1035 may be performed by a communications manager as described with reference to FIGS. 5 through 8.

It should be noted that the methods described herein describe possible implementations, and that the operations and the steps may be rearranged or otherwise modified and that other implementations are possible. Further, aspects from two or more of the methods may be combined.

Techniques described herein may be used for various wireless communications systems such as code division multiple access (CDMA), time division multiple access (TDMA), frequency division multiple access (FDMA), orthogonal frequency division multiple access (OFDMA), single carrier frequency division multiple access (SC-FDMA), and other systems. A CDMA system may implement a radio technology such as CDMA2000, Universal Terrestrial Radio Access (UTRA), etc. CDMA2000 covers IS-2000, IS-95, and IS-856 standards. IS-2000 Releases may be commonly referred to as CDMA2000 1x, 1x, etc. IS-856 (TIA-856) is commonly referred to as CDMA2000 1xEV-DO, High Rate Packet Data (HRPD), etc. UTRA includes Wideband CDMA (WCDMA) and other variants of CDMA. A TDMA system may implement a radio technology such as Global System for Mobile Communications (GSM).

An OFDMA system may implement a radio technology such as Ultra Mobile Broadband (UMB), Evolved UTRA (E-UTRA), Institute of Electrical and Electronics Engineers (IEEE) 802.11 (Wi-Fi), IEEE 802.16 (WiMAX), IEEE 802.20, Flash-OFDM, etc. UTRA and E-UTRA are part of Universal Mobile Telecommunications System (UMTS). LTE, LTE-A, and LTE-A Pro are releases of UMTS that use E-UTRA. UTRA, E-UTRA, UMTS, LTE, LTE-A, LTE-A Pro, NR, and GSM are described in documents from the organization named "3rd Generation Partnership Project" (3GPP). CDMA2000 and UMB are described in documents from an organization named "3rd Generation Partnership Project 2" (3GPP2). The techniques described herein may be used for the systems and radio technologies mentioned herein as well as other systems and radio technologies. While aspects of an LTE, LTE-A, LTE-A Pro, or NR system may be described for purposes of example, and LTE, LTE-A, LTE-A Pro, or NR terminology may be used in much of the description, the techniques described herein are applicable beyond LTE, LTE-A, LTE-A Pro, or NR applications.

A macro cell generally covers a relatively large geographic area (e.g., several kilometers in radius) and may allow unrestricted access by UEs with service subscriptions with the network provider. A small cell may be associated with a lower-powered base station, as compared with a macro cell, and a small cell may operate in the same or different (e.g., licensed, unlicensed, etc.) frequency bands as macro cells. Small cells may include pico cells, femto cells, and micro cells according to various examples. A pico cell, for example, may cover a small geographic area and may allow unrestricted access by UEs with service subscriptions with the network provider. A femto cell may also cover a small geographic area (e.g., a home) and may provide restricted access by UEs having an association with the femto cell (e.g., UEs in a closed subscriber group (CSG), UEs for users in the home, and the like). An eNB for a macro cell may be referred to as a macro eNB. An eNB for a small cell may be referred to as a small cell eNB, a pico eNB, a femto eNB, or a home eNB. An eNB may support one or multiple (e.g., two, three, four, and the like) cells, and may also support communications using one or multiple component carriers.

The wireless communications systems described herein may support synchronous or asynchronous operation. For synchronous operation, the base stations may have similar frame timing, and transmissions from different base stations may be approximately aligned in time. For asynchronous operation, the base stations may have different frame timing, and transmissions from different base stations may not be aligned in time. The techniques described herein may be used for either synchronous or asynchronous operations.

Information and signals described herein may be represented using any of a variety of different technologies and techniques. For example, data, instructions, commands, information, signals, bits, symbols, and chips that may be referenced throughout the description may be represented by voltages, currents, electromagnetic waves, magnetic fields or particles, optical fields or particles, or any combination thereof. Further, some embodiments may be configured to work with information and signals stored in a non-transitory medium.

The various illustrative blocks and modules described in connection with the disclosure herein may be implemented or performed with a general-purpose processor, a DSP, an ASIC, an FPGA, or other programmable logic device, discrete gate or transistor logic, discrete hardware components, or any combination thereof designed to perform the functions described herein. A general-purpose processor may be a microprocessor, but in the alternative, the processor may be any conventional processor, controller, microcontroller, or state machine. A processor may also be implemented as a combination of computing devices (e.g., a combination of a DSP and a microprocessor, multiple microprocessors, one or more microprocessors in conjunction with a DSP core, or any other such configuration).

The functions described herein may be implemented in hardware, software executed by a processor, firmware, or any combination thereof. If implemented in software executed by a processor, the functions may be stored on or transmitted over as one or more instructions or code on a computer-readable medium. Other examples and implementations are within the scope of the disclosure and appended claims. For example, due to the nature of software, functions described herein can be implemented using software executed by a processor, hardware, firmware, hardwiring, or combinations of any of these. Features implementing functions may also be physically located at various positions, including being distributed such that portions of functions are implemented at different physical locations.

Computer-readable media includes both non-transitory computer storage media and communication media including any medium that facilitates transfer of a computer program from one place to another. A non-transitory storage medium may be any available medium that can be accessed by a general purpose or special purpose computer. By way of example, and not limitation, non-transitory computer-readable media may include random-access memory (RAM), read-only memory (ROM), electrically erasable programmable ROM (EEPROM), flash memory, compact disk (CD) ROM or other optical disk storage, magnetic disk storage or other magnetic storage devices, or any other non-transitory medium that can be used to carry or store desired program code means in the form of instructions or data structures and that can be accessed by a general-purpose or special-purpose computer, or a general-purpose or special-purpose processor. Also, any connection is properly termed a computer-readable medium. For example, if the software is transmitted from a website, server, or other remote source using a coaxial cable, fiber optic cable, twisted pair, digital subscriber line (DSL), or wireless technologies such as infrared, radio, and microwave, then the coaxial cable, fiber optic cable, twisted pair, DSL, or wireless technologies such as infrared, radio, and microwave are included in the definition of medium. Disk and disc, as used herein, include CD, laser disc, optical disc, digital versatile disc (DVD), floppy disk and Blu-ray disc where disks usually reproduce data magnetically, while discs reproduce data optically with lasers. Combinations of the above are also included within the scope of computer-readable media.

As used herein, including in the claims, "or" as used in a list of items (e.g., a list of items prefaced by a phrase such as "at least one of" or "one or more of") indicates an inclusive list such that, for example, a list of at least one of A, B, or C means A or B or C or AB or AC or BC or ABC (i.e., A and B and C). Also, as used herein, the phrase "based on" shall not be construed as a reference to a closed set of conditions. For example, an exemplary step that is described as "based on condition A" may be based on both a condition A and a condition B without departing from the scope of the present disclosure. In other words, as used herein, the phrase "based on" shall be construed in the same manner as the phrase "based at least in part on."

In the appended figures, similar components or features may have the same reference label. Further, various components of the same type may be distinguished by following the reference label by a dash and a second label that distinguishes among the similar components. If just the first reference label is used in the specification, the description is applicable to any one of the similar components having the same first reference label irrespective of the second reference label, or other subsequent reference label.

The description set forth herein, in connection with the appended drawings, describes example configurations and does not represent all the examples that may be implemented or that are within the scope of the claims. The term "exemplary" used herein means "serving as an example, instance, or illustration," and not "preferred" or "advantageous over other examples." The detailed description includes specific details for the purpose of providing an understanding of the described techniques. These techniques, however, may be practiced without these specific details. In some instances, well-known structures and devices are shown in block diagram form in order to avoid obscuring the concepts of the described examples.

The description herein is provided to enable a person skilled in the art to make or use the disclosure. Various modifications to the disclosure will be readily apparent to those skilled in the art, and the generic principles defined herein may be applied to other variations without departing from the scope of the disclosure. Thus, the disclosure is not limited to the examples and designs described herein, but is to be accorded the broadest scope consistent with the principles and novel features disclosed herein.

What is claimed is:

1. A method for wireless communication, comprising:
    monitoring a plurality of master information block broadcasts from a base station to obtain a first set of samples associated with a first set of one or more prior transmission time intervals (TTIs) and a second set of samples associated with a current TTI;
    identifying a payload change in the master information block broadcasts between the first set of one or more prior TTIs and the current TTI based at least in part on a comparison between the first set of samples and the second set of samples;
    modifying the first set of samples based at least in part on the identified payload change; and
    decoding a master information block based at least in part on a combination of the modified first set of samples and the second set of samples.

2. The method of claim 1, further comprising:
    identifying coded bits corresponding to the identified payload change; and
    changing a sign of one or more samples in the first set of samples, the one or more samples corresponding to a system frame number.

3. The method of claim 1, further comprising:
    obtaining soft metrics for the first set of samples and the second set of samples by identifying a plurality of possible payload changes and determining a probability value for each possible payload change; and
    wherein identifying the payload change is based at least in part on the soft metrics obtained for the first set of samples and the second set of samples.

4. The method of claim 1, further comprising:
    obtaining hard metrics for the first set of samples and the second set of samples by identifying a plurality of possible payload changes and selecting a most likely payload change from the plurality of possible payload changes; and
    wherein identifying the payload change is based at least in part on the hard metrics obtained for the first set of samples and the second set of samples.

5. The method of claim 1, wherein identifying the payload change comprises:
    selecting the payload change from a fixed set of possible changes in a system frame number between the first set of one or more prior TTIs and the current TTI.

6. The method of claim 5, wherein:
    identifying that the payload change is further based on a probability associated with the selected payload change.

7. The method of claim 1, wherein monitoring the plurality of master information block broadcasts comprises:
    obtaining a third set of samples associated with a second prior TTI.

8. The method of claim 7, further comprising:
    identifying a second payload change between the second prior TTI and the third prior TTI.

9. The method of claim 8, further comprising:
    modifying the third set of samples based at least in part on the identified second payload change.

10. The method of claim 9, wherein:
    decoding the master information block is based at least in part on a combination of the modified first set of samples, the modified third set of samples, and the second set of samples.

11. The method of claim 1, further comprising:
    aborting combining the first set of samples and the second set of samples based at least in part on a success of the decoding within a threshold amount of time.

12. The method of claim 1, wherein the samples include at least one of a sample from the base station unmodified by a user equipment, a sample from the base station modified by the user equipment, a log likelihood ratios, or any combination thereof.

13. An apparatus for wireless communication, comprising:
    a processor,
    memory in electronic communication with the processor; and
    instructions stored in the memory and executable by the processor to cause the apparatus to:
        monitor a plurality of master information block broadcasts from a base station to obtain a first set of samples associated with a first prior transmission time interval (TTI) and a second set of samples associated with a current TTI;
        identify a payload change in the master information block broadcasts between the first set of one or more prior TTIs and the current TTI based at least in part on a comparison between the first set of samples and the second set of samples;
        modify the first set of samples based at least in part on the identified payload change; and
        decode a master information block based at least in part on a combination of the modified first set of samples and the second set of samples.

14. The apparatus of claim 13, wherein the instructions to modify the first set of samples are executable by the processor to cause the apparatus to:
    identify coded bits corresponding to the identified payload change; and
    change a sign of one or more samples in the first set of samples, the one or more samples corresponding to a system frame number.

15. The apparatus of claim 13, wherein the instructions are further executable by the processor to cause the apparatus to:
    obtain soft metrics for the first set of samples and the second set of samples by identifying a plurality of possible payload changes and determining a probability value for each possible payload change; and
    wherein identifying the payload change is based at least in part on the soft metrics obtained for the first set of samples and the second set of samples.

16. The apparatus of claim 13, wherein the instructions are further executable by the processor to cause the apparatus to:
    obtain hard metrics for the first set of samples and the second set of samples by identifying a plurality of possible payload changes and selecting a most likely payload change from the plurality of possible payload changes; and wherein identifying the payload change is based at least in part on the hard metrics obtained for the first set of samples and the second set of samples.

17. The apparatus of claim 13, wherein the instructions to identify the payload change are executable by the processor to cause the apparatus to:
select the payload change from a fixed set of possible changes in a system frame number between the first set of one or more prior TTIs and the current TTI.

18. The apparatus of claim 17, wherein identifying the payload change is further based on a probability associated with the selected payload change.

19. The apparatus of claim 13, wherein the instructions to monitor the plurality of master information block broadcasts are executable by the processor to cause the apparatus to:
obtain a third set of samples associated with a second prior TTI.

20. The apparatus of claim 19, wherein the instructions are further executable by the processor to cause the apparatus to:
identify a second payload change between the second prior TTI and the third prior TTI.

21. The apparatus of claim 20, wherein the instructions are further executable by the processor to cause the apparatus to:
modify the third set of samples based at least in part on the identified second payload change.

22. The apparatus of claim 21, wherein decoding the master information block is based at least in part on a combination of the modified first set of samples, the modified third set of samples, and the second set of samples.

23. The apparatus of claim 13, wherein the instructions are further executable by the processor to cause the apparatus to:
abort combining the first set of samples and the second set of samples based at least in part on a success of the decoding within a threshold amount of time.

24. The apparatus of claim 13, wherein the samples include at least one of a sample from the base station unmodified by a user equipment, a sample from the base station modified by the user equipment, a log likelihood ratios, or any combination thereof.

25. An apparatus for wireless communication, comprising:
means for monitoring a plurality of master information block broadcasts from a base station to obtain a first set of samples associated with a first prior transmission time interval (TTI) and a second set of samples associated with a current TTI;
means for identifying a payload change in the master information block broadcasts between the first set of one or more prior TTIs and the current TTI based at least in part on a comparison between the first set of samples and the second set of samples;
means for modifying the first set of samples based at least in part on the identified payload change; and
means for decoding a master information block based at least in part on a combination of the modified first set of samples and the second set of samples.

26. The apparatus of claim 25, wherein the means for modifying the first set of samples comprises:
means for identifying coded bits corresponding to the identified payload change; and
means for changing a sign of one or more samples in the first set of samples, the one or more samples corresponding to a system frame number.

27. The apparatus of claim 25, further comprising:
means for obtaining soft metrics for the first set of samples and the second set of samples by identifying a plurality of possible payload changes and determining a probability value for each possible payload change; and
wherein identifying the payload change is based at least in part on the soft metrics obtained for the first set of samples and the second set of samples.

28. The apparatus of claim 25, further comprising:
means for obtaining hard metrics for the first set of samples and the second set of samples by identifying a plurality of possible payload changes and selecting a most likely payload change from the plurality of possible payload changes; and
wherein identifying the payload change is based at least in part on the hard metrics obtained for the first set of samples and the second set of samples.

29. The apparatus of claim 25, wherein the means for identifying the payload change comprises:
means for selecting the payload change from a fixed set of possible changes in a system frame number between the first set of one or more prior TTIs and the current TTI.

30. A non-transitory computer-readable medium storing code for wireless communication, the code comprising instructions executable by a processor to:
monitor a plurality of master information block broadcasts from a base station to obtain a first set of samples associated with a first prior transmission time interval (TTI) and a second set of samples associated with a current TTI;
identify a payload change in the master information block broadcasts between the first set of one or more prior TTIs and the current TTI based at least in part on a comparison between the first set of samples and the second set of samples;
modify the first set of samples based at least in part on the identified payload change; and
decode a master information block based at least in part on a combination of the modified first set of samples and the second set of samples.

* * * * *